(12) United States Patent
Cohen et al.

(10) Patent No.: US 7,303,663 B2
(45) Date of Patent: Dec. 4, 2007

(54) MULTISTEP RELEASE METHOD FOR ELECTROCHEMICALLY FABRICATED STRUCTURES

(75) Inventors: Adam L. Cohen, Van Nuys, CA (US); Michael S. Lockard, Van Nuys, CA (US); Dale S. McPherson, Kissimmee, FL (US)

(73) Assignee: Microfabrica, Inc., Van Nuys, CA (US)

( * ) Notice: Subject to any disclaimer, the term of this patent is extended or adjusted under 35 U.S.C. 154(b) by 203 days.

(21) Appl. No.: 10/434,497

(22) Filed: May 7, 2003

(65) Prior Publication Data

US 2004/0007468 A1    Jan. 15, 2004

(51) Int. Cl.
*C25D 5/02* (2006.01)
*C25D 5/10* (2006.01)
*C25D 5/12* (2006.01)
*C25D 5/48* (2006.01)
*C25D 5/52* (2006.01)

(52) U.S. Cl. .............. 205/118; 205/135; 205/170; 205/181; 205/182; 205/221; 205/222; 205/223; 205/229

(58) Field of Classification Search ............. 205/118, 205/135, 170, 181, 182, 220, 221, 222, 223, 205/229
See application file for complete search history.

(56) References Cited

U.S. PATENT DOCUMENTS 5,190,637 A * 3/1993 Guckel ................. 205/118
6,027,630 A * 2/2000 Cohen ................. 205/135

OTHER PUBLICATIONS

Cohen et al., "EFAB: Rapid, low-cost desktop micromachining of high aspect ratio true 3-D MEMS," 12th IEEE International Conference on Microelectromechanical Systems, p. 244-251 (Jan. 17-21, 1999).*

* cited by examiner

*Primary Examiner*—Edna Wong
(74) *Attorney, Agent, or Firm*—Dennis R. Smalley

(57) ABSTRACT

Multilayer structures are electrochemically fabricated from at least one structural material (e.g. nickel), that is configured to define a desired structure and which may be attached to a substrate, and from at least one sacrificial material (e.g. copper) that surrounds the desired structure. After structure formation, the sacrificial material is removed by a multi-stage etching Operation. In some embodiments sacrificial material to be removed may be located within passages or the like on a substrate or within an add-on component. The multi-stage etching Operations may be separated by intermediate post processing activities, they may be separated by cleaning Operations, or barrier material removal Operations, or the like. Barriers may be fixed in position by contact with structural material or with a substrate or they may be solely fixed in position by sacrificial material and are thus free to be removed after all retaining sacrificial material is etched.

11 Claims, 22 Drawing Sheets

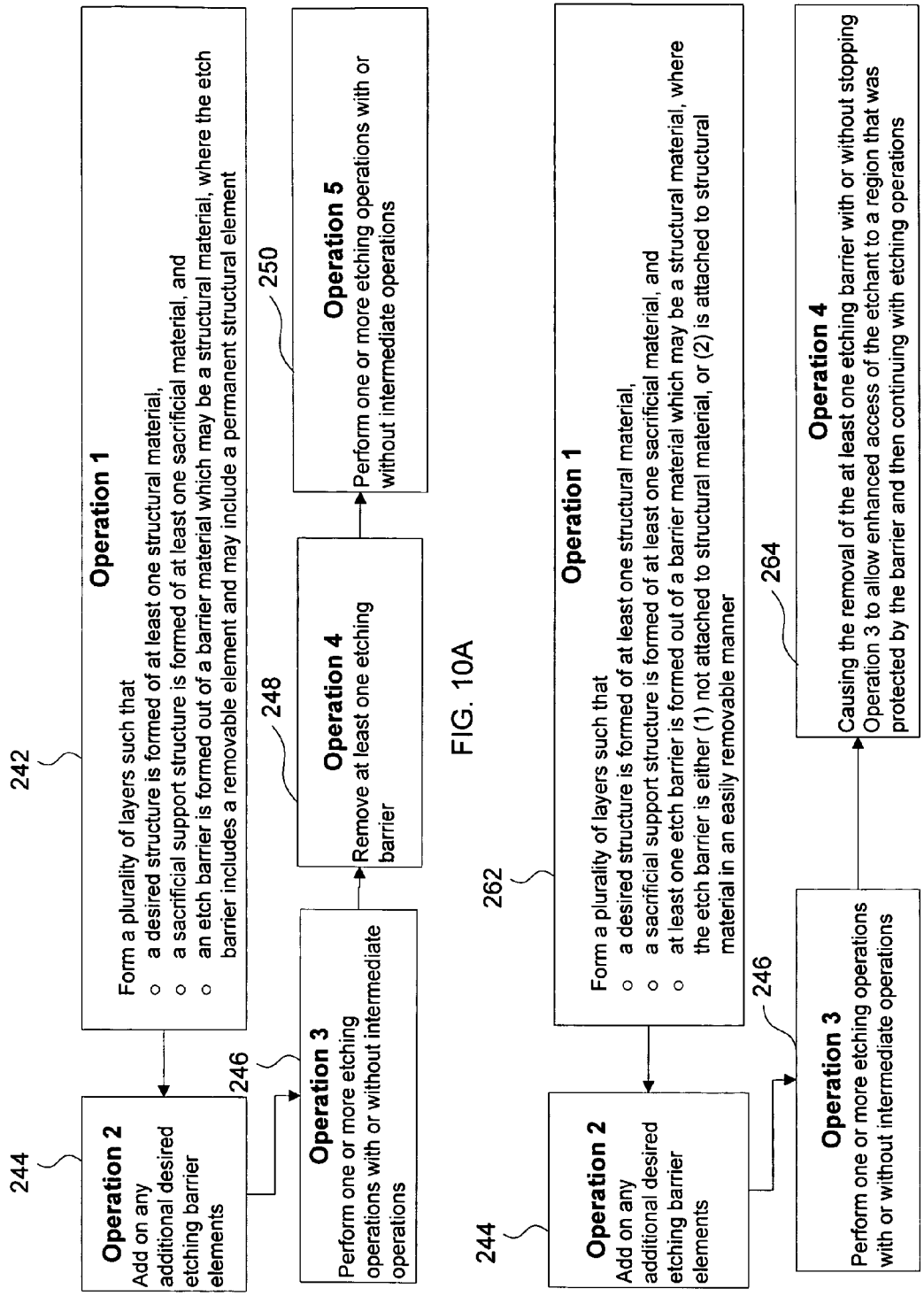

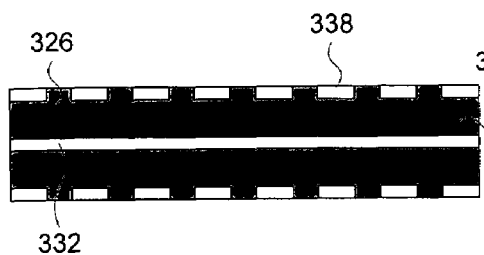
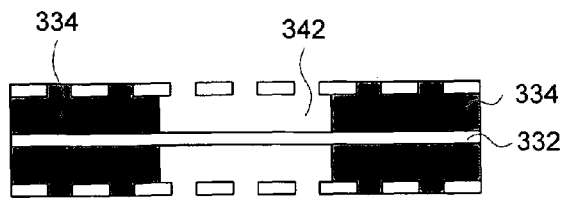
FIG. 12A                                   FIG. 12B
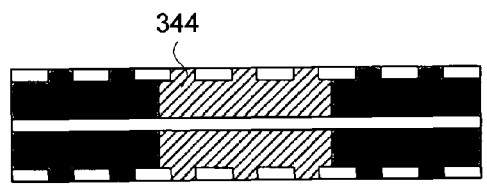
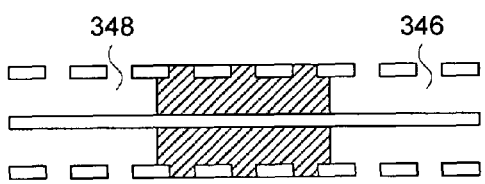
FIG. 12C                                   FIG. 12D
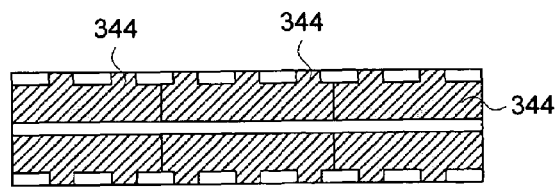
FIG. 12E

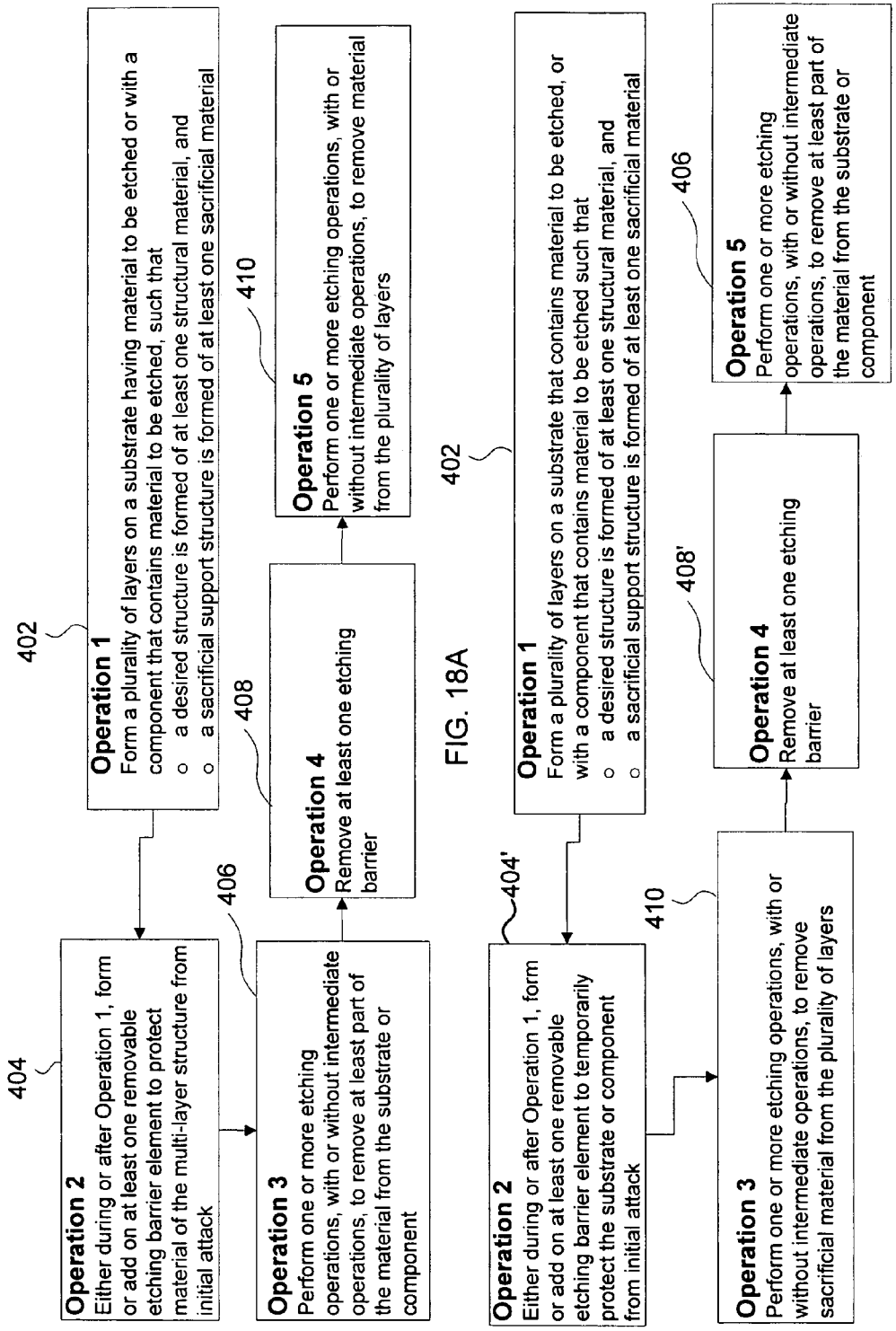

US 7,303,663 B2

MULTISTEP RELEASE METHOD FOR ELECTROCHEMICALLY FABRICATED STRUCTURES

RELATED APPLICATIONS

This application claims benefit of U.S. Provisional Patent Application Nos. 60/379,184, filed May 7, 2002, and 60/392,531, filed Jun. 27, 2002, both of which are hereby incorporated herein by reference as if set forth in full herein.

FIELD OF THE INVENTION

The present invention relates generally to the field of electrochemical fabrication and the associated formation of three-dimensional structures via a layer-by-layer build up of deposited materials. In particular, it relates to the formation of microstructures embedded in sacrificial material and the release of those microstructures from the sacrificial materials via two or more distinct etching operations.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.
2. A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.
3. A. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., Apr. 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
8. A. Cohen, "Electrochemical Fabrication (EFAB™)", Chapter 19 of The MEMS Handbook, edited by Mohamed Gad-EI-Hak, CRC Press, 2002.
9. "Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6 separated from mask 8. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating, as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that comprises a patterned conformable material 10' and a support structure 20. FIG. 1d also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to the above teachings, the '630 patent indicates that electroplating methods can be used in combination with insulating materials. In particular it indicates that though the electroplating methods have been described with respect to two metals, a variety of materials, e.g., polymers, ceramics and semiconductor materials, and any number of metals can be deposited either by the electroplating methods described, or in separate processes that occur throughout the electroplating method. It further indicates that a thin plating base can be deposited, e.g., by sputtering, over a deposit that is insufficiently conductive (e.g., an insulating layer) so as to enable continued electroplating. It even further indicates that multiple support materials can be included in the electroplated element allowing selective removal of the support materials.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Even in view of these teaching, a need remains in the electrochemical fabrication arts for techniques that can improve production reliability, enhance control of post-layer fabrication process operations, ease post layer fabrication handling, and even overcome process defects that might otherwise result in production failures.

SUMMARY OF THE INVENTION

An object of some embodiments of various aspects of the invention is to improve electrochemical fabrication production reliability.

An object of some embodiments of various aspects of the invention is to enhance control of post-layer fabrication process control, overcome process defects that would otherwise result in production failures.

An object of some embodiments of various aspects of the invention is to ease post layer fabrication handling.

An object of some embodiments of various aspects of the invention is to overcome process defects that might otherwise result in production failures.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively may not address any of the objects set forth above but instead address some other object ascertained from the teachings herein. It is not intended that all of these objects be addressed by any single aspect of the invention even though that may be the case with regard to some aspects.

A first aspect of the invention provides an electrochemical fabrication process for producing a multi-layer three-dimensional structure from a plurality of adhered layers, the process including: (A) forming a layer by depositing at least one sacrificial material and at least one structural material onto a substrate, wherein the substrate may include previously deposited layers, and wherein the depositing of at least one of the materials includes an electrodeposition Operation; (B) repeating (A) one or more times such that a plurality of layers are formed and such that successive layers are formed adjacent to and adhered to previously formed layers; (C) performing a first etching Operation to remove at least a first portion of at least one material from the plurality of layers or from the substrate; and (D) performing a second etching Operation, which is distinct from the first etching Operation, to remove at least a portion of at least one material from the plurality of layer or from the substrate.

A second aspect of the invention provides an electrochemical fabrication process for producing a three-dimensional structure from a plurality of adhered layers, the process including: (A) forming a layer by depositing at least one sacrificial material and at least one structural material onto a substrate, wherein the substrate may include previously deposited layers, and wherein the depositing of at least one of the materials includes an electrodeposition Operation; (B) repeating (A) one or more times such that a plurality of layers are formed and such that successive layers are formed adjacent to and adhered to previously formed layers; (C)

performing a first etching Operation to remove at least a first portion of at least one material from the plurality of layers or from the substrate; (D) performing an intervening Operation, after performing the first etching Operation; (E) performing a second etching Operation, after the intervening Operation, to remove at least a portion of at least one material from the plurality of layer or from the substrate.

Further aspects of the invention will be understood by those of skill in the art upon reviewing the teachings herein. Other aspects of the invention may involve apparatus that can be used in implementing one or more of the above method aspects of the invention. Still other aspects of the invention may involve various combinations of the aspects presented above, addition of various features of one or more embodiments, as well as provide other configurations, structures, functional relationships, and processes that have not been specifically set forth above.

BRIEF DESCRIPTION OF THE DRAWINGS

FIGS. 10A and 10B depict block diagrams of fourth and fifth group of embodiments.

FIGS. 12A-12E schematically depict various stages of an etching and infiltration process as seen on a horizontal plane (a plane parallel to the plane of the substrate) mid way through a coaxial transmission line similar to one of the four branches of the RF filter element of FIG. 11 where a central conductor can be seen along with etching holes on each side of the outer conductor.

FIG. 17A depicts an end view of one of the coaxial arms of the filter of and etching barrier of FIGS. 15 and 16, while

FIGS. 18A and 18B depict block diagrams of process operations associated with sixth and seventh groups of embodiments.

DETAILED DESCRIPTION

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
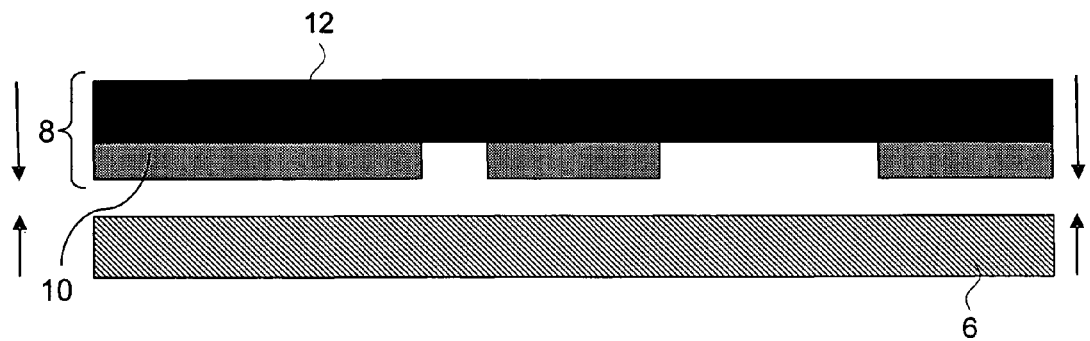
FIGS. 1A-1C schematically depict side views of various stages of a CC mask plating process, while FIGS. 1D-1G schematically depict a side views of various stages of a CC mask plating process using a different type of CC mask.
Figure 1B:
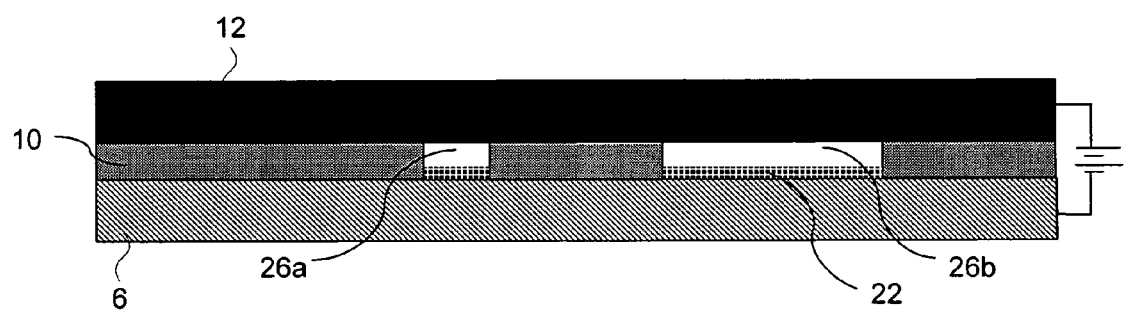
Figure 1C:
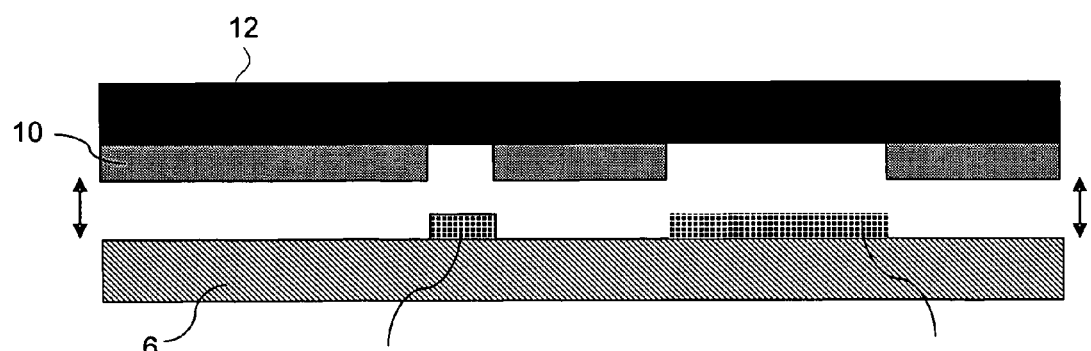
Figure 1D:
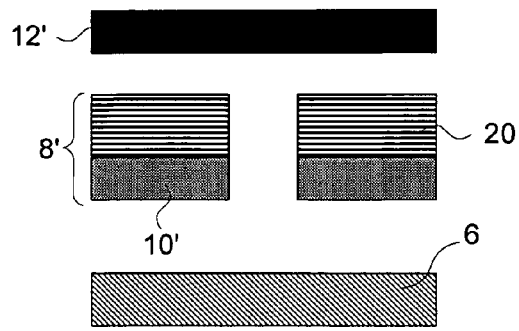
Figure 1E:
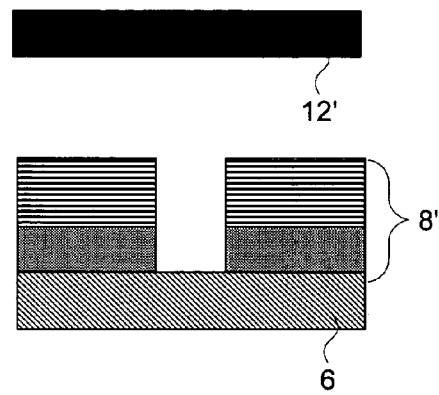
Figure 1F:
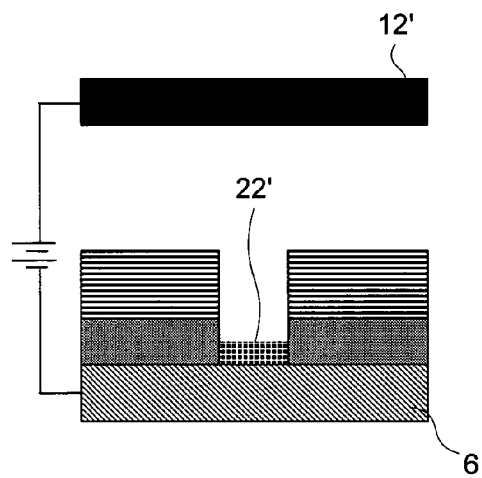
Figure 1G:
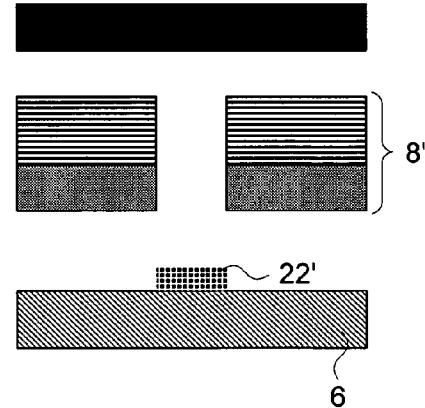
Figure 2A:
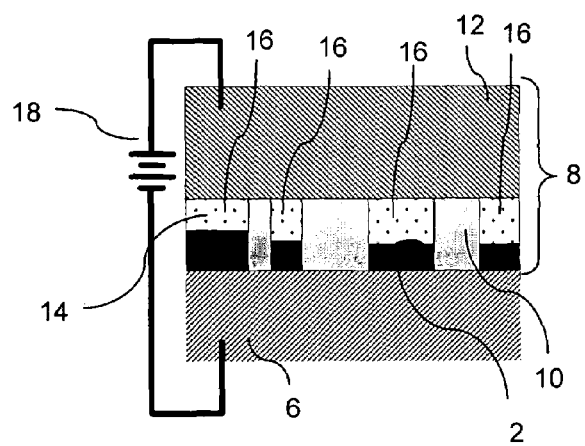
FIGS. 2A-2F schematically depict side views of various stages of an electrochemical fabrication process as applied to the formation of a particular structure where a sacrificial material is selectively deposited while a structural material is blanket deposited.
Figure 2B:
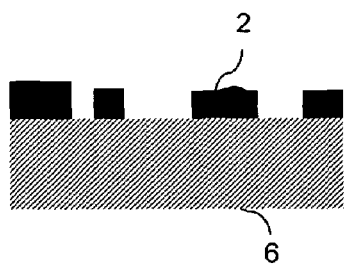
Figure 2C:
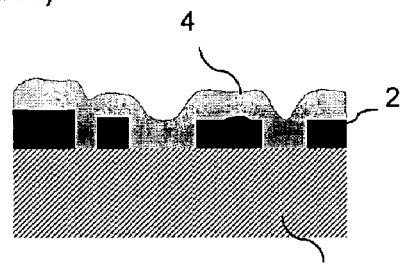
Figure 2D:
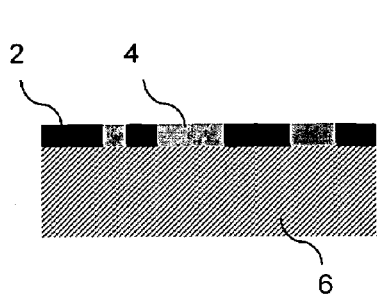
Figure 2E:
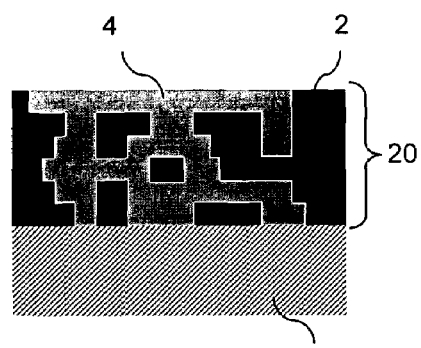
Figure 2F:
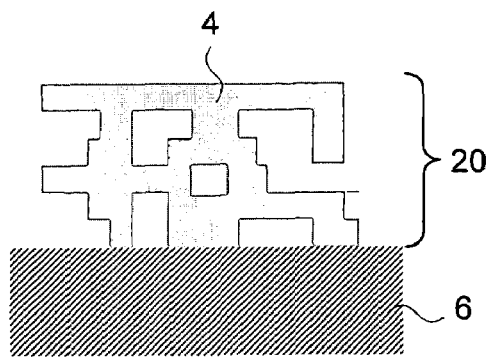
Figure 3A:
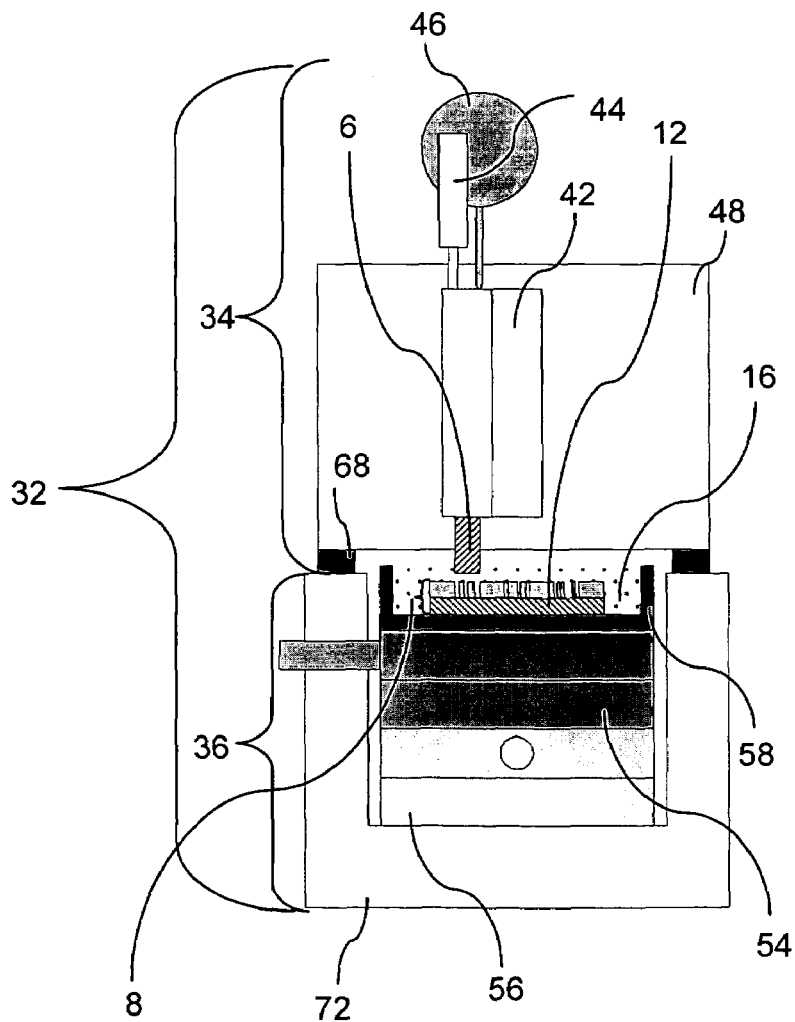
FIGS. 3A-3C schematically depict side views of various example subassemblies that may be used in manually implementing the electrochemical fabrication method depicted in FIGS. 2A-2F.
Figure 3B:
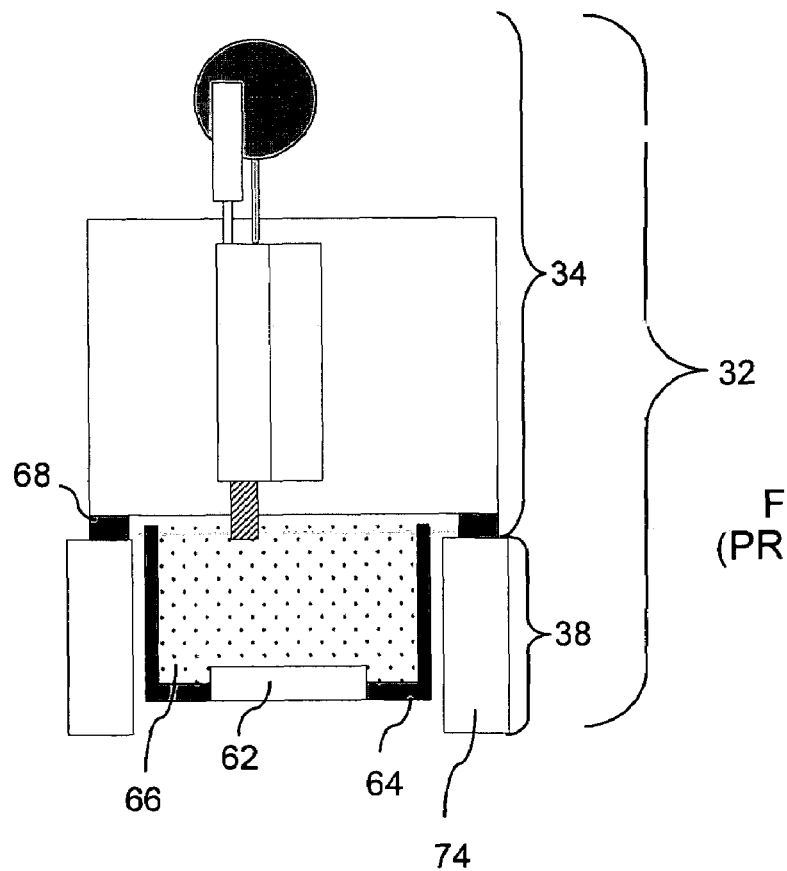
Figure 3C:
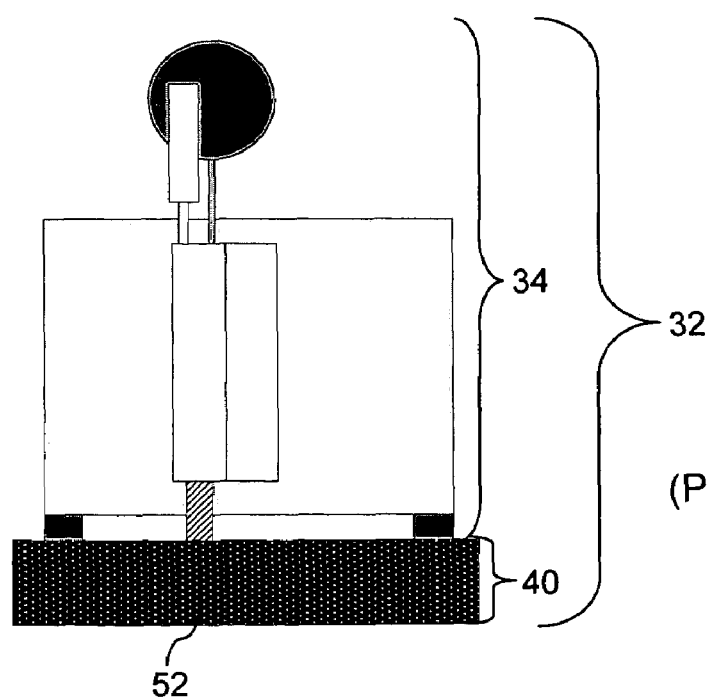
Figure 4A:
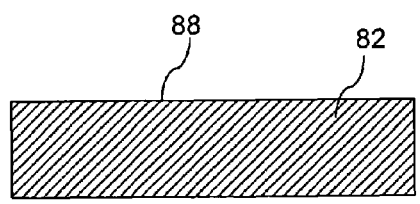
FIGS. 4A-4F schematically depict the formation of a first layer of a structure using adhered mask plating where the blanket deposition of a second material overlays both the openings between deposition locations of a first material and the first material itself.
Figure 4B:
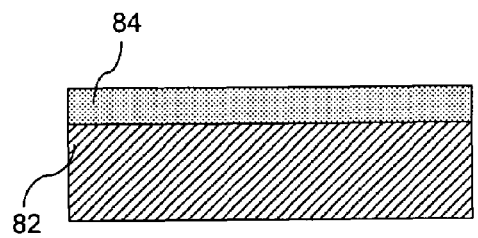
Figure 4C:
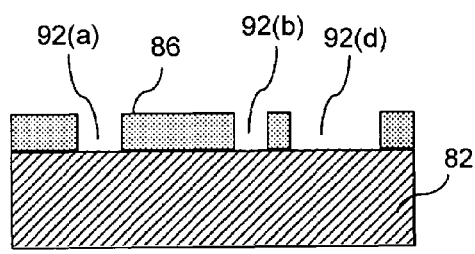
Figure 4D:
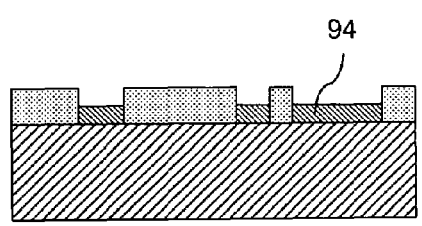
Figure 4E:
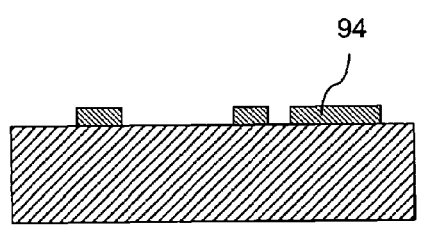
Figure 4F:
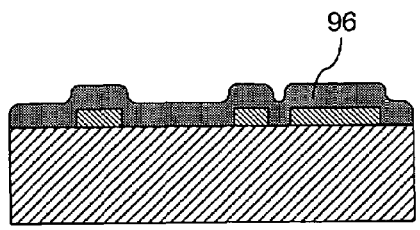
Figure 4G:
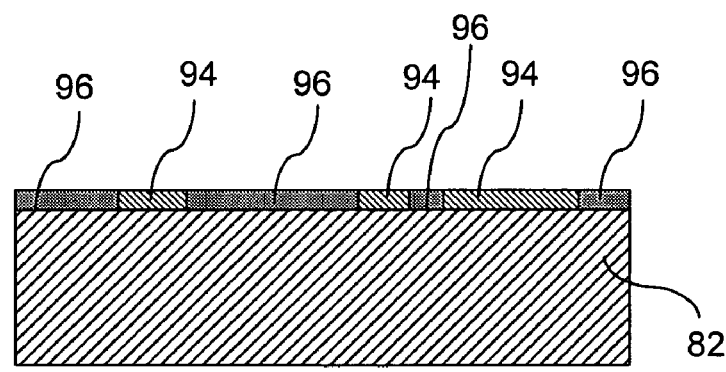
FIG. 4G depicts the completion of formation of the first layer resulting from planarizing the deposited materials to a desired level.
Figure 4H:
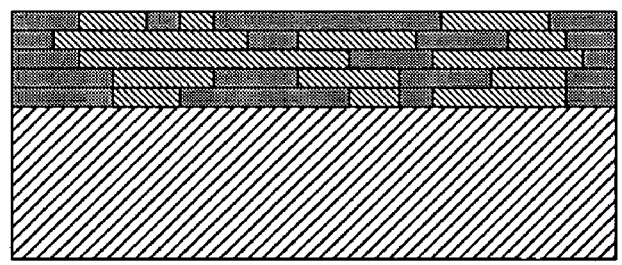
FIGS. 4H and 4I respectively depict the state of the process after formation of the multiple layers of the structure and after release of the structure from the sacrificial material).
Figure 4I:
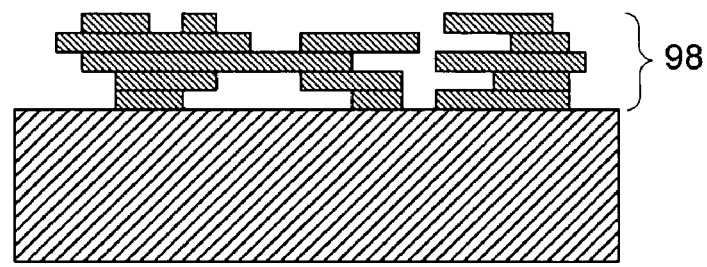

FIGS. 4A-4F illustrate various stages in the formation of a single layer of a multi-layer fabrication process where a second metal is deposited on a first metal as well as in openings in the first metal so that the first and second metal form part of the layer. In FIG. 4A a side view of a substrate 82 is shown onto which patternable photoresist 84 is cast as shown in FIG. 4B. In FIG. 4C a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D a metal 94 (e.g. nickel) is shown as having been electroplated into the openings 92(a)-92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure is shown where each layer consists of two materials. For most applications, one of these materials is removed as shown in FIG. 4I to yield a desired 3-D structure 98 (e.g. component or device).

The various embodiments, alternatives, and techniques disclosed herein may be used in combination with electrochemical fabrication techniques that use different types of patterning masks and masking techniques. For example, conformable contact masks and masking operations may be used, proximity masks and masking operations (i.e. operations that use masks that at least partially selectively shield a substrate by their proximity to the substrate even if contact is not made) may be used, non-conformable masks and masking operations (i.e. masks and operations based on masks whose contact surfaces are not significantly conformable) may be used, and adhered masks and masking operations (masks and operations that use masks that are adhered to a substrate onto which selective deposition or etching is to occur as opposed to only being contacted to it) may be used.

Figures 5A, 5B:
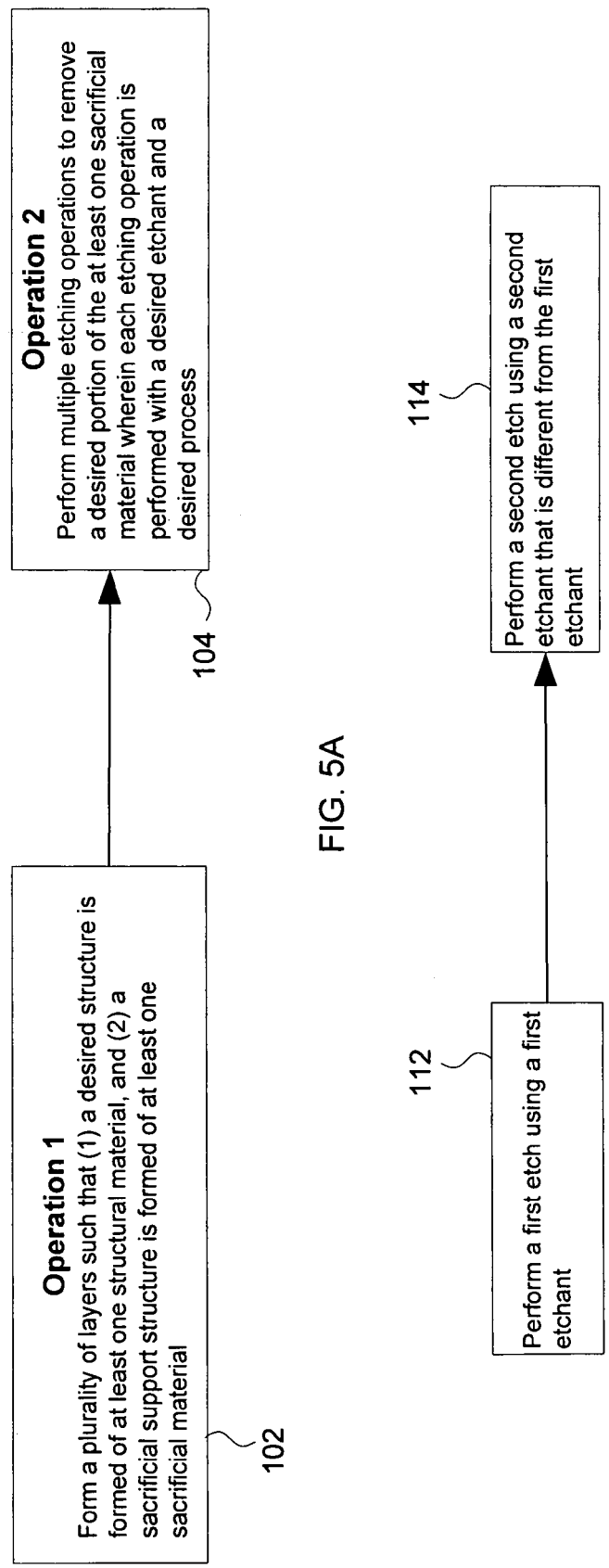
FIG. 5A depicts a block diagram of the basic steps of a first group of embodiments.
FIGS. 5B-5D depict block diagrams expanding on samples of alternatives for Operation 2 of FIG. 5A.

FIG. 5A depicts a block diagram of the basic elements or operations of a first group of embodiments. Block 102 indicates that in a first operation (i.e. Operation 1) a plurality of layers will be formed (e.g. by electrochemical fabrication) and that the layers will include: (1) a desired structure that is formed from at least one structural material, and (2) a sacrificial support structure that is formed from at least one sacrificial material. Block 104 indicates that a second operation (i.e. Operation 2) will include the performance of a plurality of etching operations for the purpose of removing a desired portion of the at least one sacrificial material wherein each etching operation is performed with a desired etchant and a desired process. In the present application, some embodiments involve use of two or more etching operations with each separated from the other by "hard stops" (i.e. fixed or substantially fixed end points or results to the etching operations).

Figure 5C:
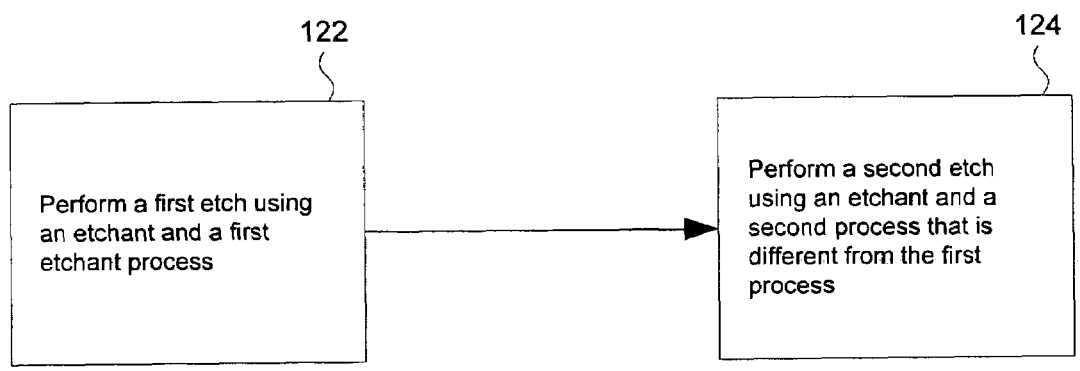
Figure 5D:
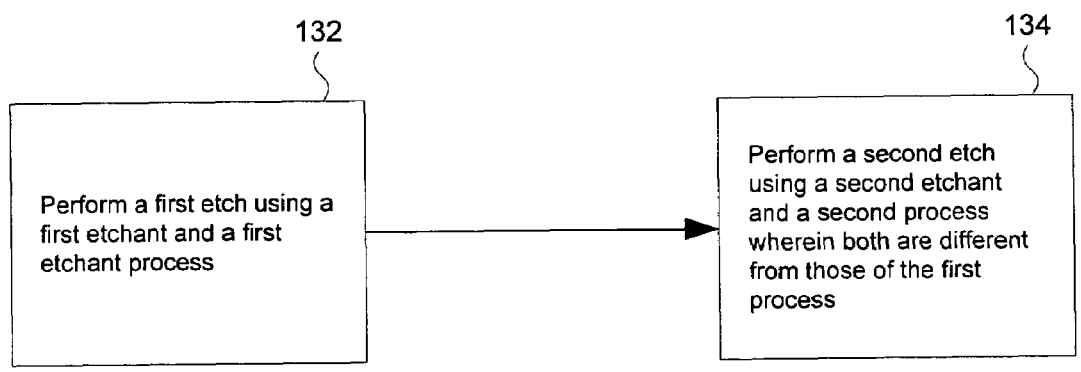

FIGS. 5B-5D depict block diagrams expanding on examples of various alternative embodiments for Operation 2 of FIG. 5. In FIG. 5B, it is indicated that Operation 2 includes at least two elements: (1) a first etch using a first etchant, 112, and (2) a second etch using a second etchant that is different from the first etchant, 114. In FIG. 5C, it is indicated that Operation 2 includes at least two elements: (1) a first etch using an etchant and a first process, 122, and (2) a second etch using an etchant and a second process that is different from the first process, 124. In FIG. 6C, it is indicated that Operation 2 includes at least two elements: (1) a first etch using a first etchant and a first etchant process, 132, and (2) a second etch using a second etchant and a second process, 134, wherein the second etchant is different from the first etchant and the first process is different from the second process. For the purposes of the present application varying the time of etching is not considered to constitute a different etching process, but varying the temperature, varying the type of or lack of agitation, or flow used, varying the concentration of etchant significantly, or varying other parameters would constitute a different process.

Figure 6A:
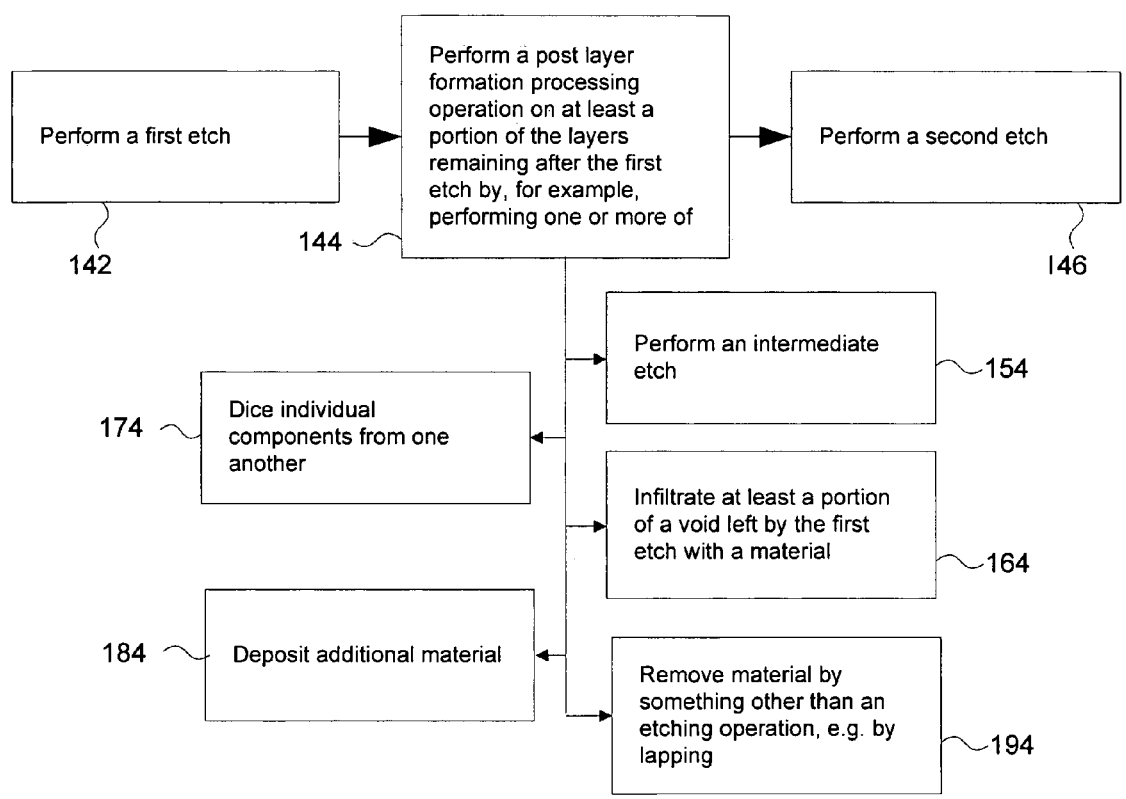
FIG. 6A depicts a block diagram of a second group of embodiments.

In FIG. 6A, it is indicated that Operation 2 includes at least three elements: (1) a first etch, 142, (2) performance of a post processing step (i.e. post layer formation processing step) on at least a portion of the layers remaining after the first etch, 144, and (3) a second etch. FIG. 6A further provides five examples of what might be involved in performance of the second task 144: (A) performance of an intermediate etch, 154, (B) infiltration of at least a portion of a void left by the first etch with a material, 164, (C) dicing of individual components to separate them from one another, 174, (D) deposition of additional material, 184; and (E) removal of some material by other than an etching operation, such as a planarization operation, 194.

Figure 6B:
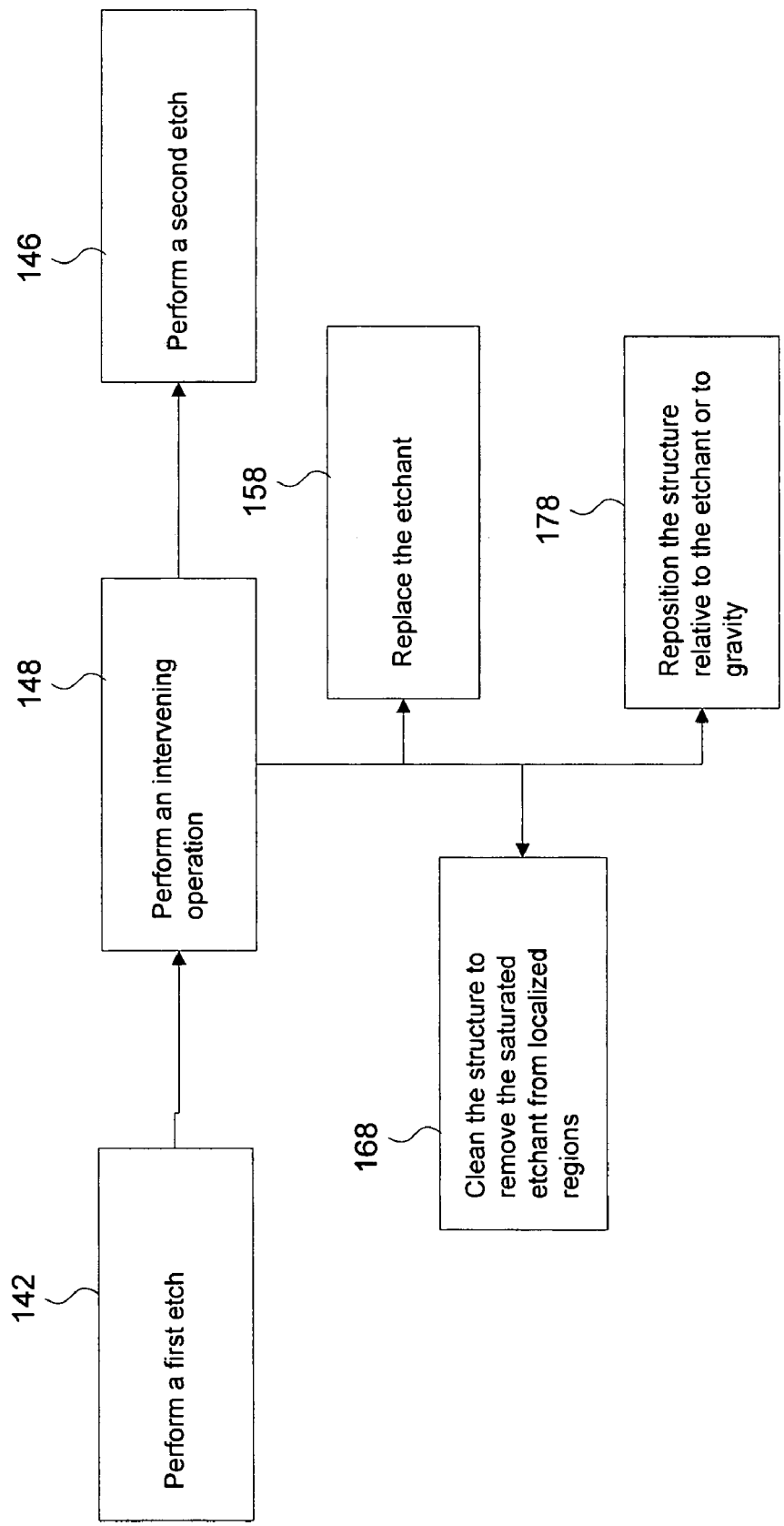
FIG. 6B depicts a block diagram of a third group of embodiments.

In FIG. 6B it is indicated that Operation 2 includes at least three elements: (1) a first etch, 142, (2) performance of an intervening operation, 148, and (3) a second etch, 146. FIG. 6B further provides three examples of what might be involved in performance of the intervening task 148: (A) replacement of the etchant that is being used, 158; (B) cleaning of the structure to remove saturated etchant from localized regions, 168; and (C) repositioning the structure with respect to the etchant, e.g. by rotating it with respect to gravity to improve efficiency, by immersing a different portion of the structure to the etchant or extracting a portion of the structure from the etchant, and the like, 178. The cleaning noted in (B) may take the form of a rinse in distilled water, or other substance that may facilitate removal of the saturated etchant. It may include agitation of the structure or directed streams of the cleaning solution.

Examples of various circumstances in which some of the above embodiments might be practiced are illustrated in FIGS. 7A-7D, 8A-8C, and 9A-9C.

Figure 7A:
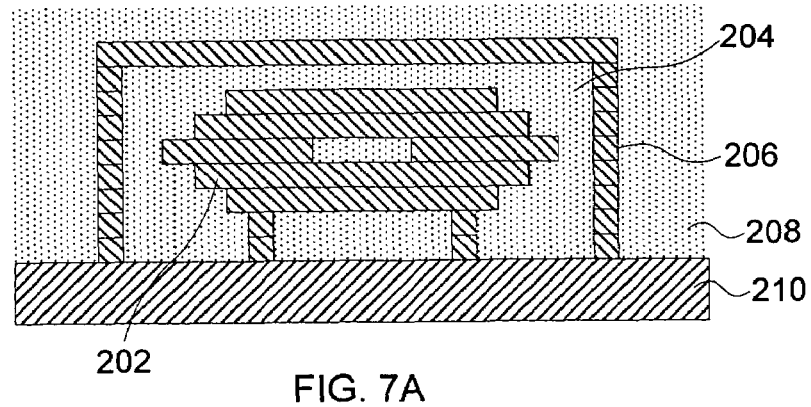
FIGS. 7A-7D schematically provide side views illustrating various stages of an embodiment of FIG. 6A as applied to a specific group of layers.
Figure 7B:
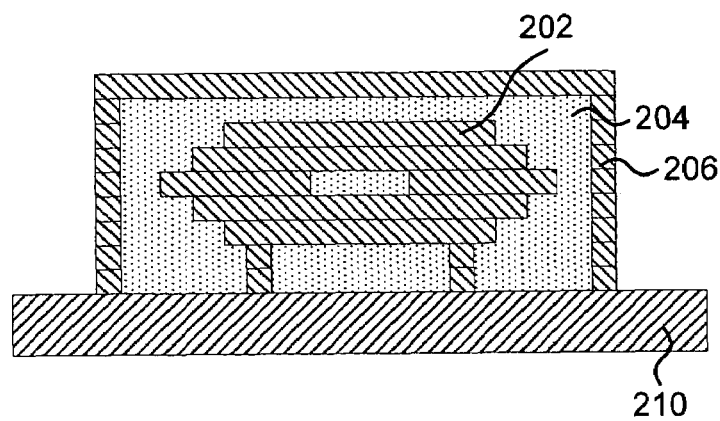
Figure 7C:
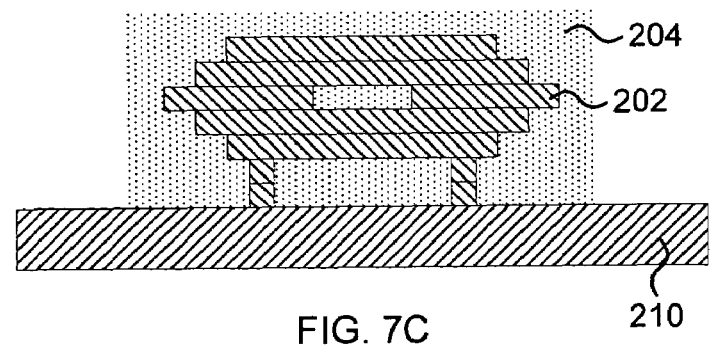
Figure 7D:
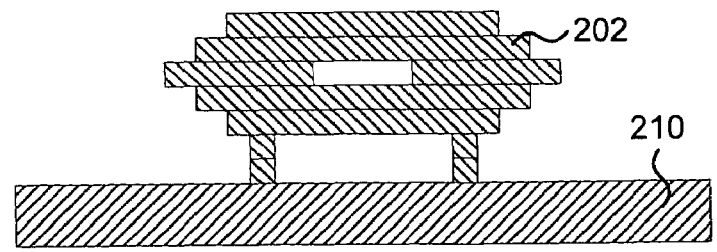

FIGS. 7A-7D illustrate an example where a single structural material is used in combination with a single sacrificial material. In this embodiment the desired multilayer structure 202 is surrounded by three levels of material. The multilayer structure is surrounded by a first region of the sacrificial material 204 (with the exception of where the structure contacts the substrate 210. The first region of sacrificial material 204 is surrounded by a barrier 206 (e.g. a thin barrier) of the structural material (with the exception of where it contacts the substrate 210). A barrier 206 is in turn surrounded by a second region of the sacrificial material 208 (with the exception of where it contacts the substrate 210). The first and second regions of sacrificial material may be a consequence of the process that was used to build up the layers (e.g. the lateral build dimensions may be fixed regardless of the lateral dimensions of the desired structure and as such what is not part of the desired structure may generally be formed of sacrificial material). In the present embodiment the barrier 206 was formed to allow a controlled etch stop to exist when the etching of region 208 occurs. In this process, the etching of the sacrificial material is preferably performed with an etchant that doesn't attack the structural material though it may be performed with an etchant that has a much slower rate of attack (e.g. more than about 10 times slower and even more preferably more than about 100 times slower) on the material of barrier 206 than on the material 208. Once the barrier material 206 is reached, etching is stopped and some other post layer fabrication activities can occur. The structural material 206 can then be etched using a selective etchant that doesn't attack the sacrificial material of 204 (or attacks it at a much slower rate). Additional post layer fabrication activities can occur at this point (i.e. after etching of material 206) if desired and then when ready a final etch of the sacrificial material 204 can occur to expose or release the desired multilayer structure 202. In one embodiment the sacrificial material may be copper and the structural material may be nickel as etchants may be appropriately selected to etch one but not the other. Various stages in the multistep etching process are exemplified in FIGS. 7B-7D. FIG. 7B depicts the stage after the removal of the outer sacrificial material 208, FIG. 7C depicts the stage after removal of the barrier material 206, and FIG. 7D depicts the final stage where the desired structure is released from sacrificial material 204.

Figure 8A:
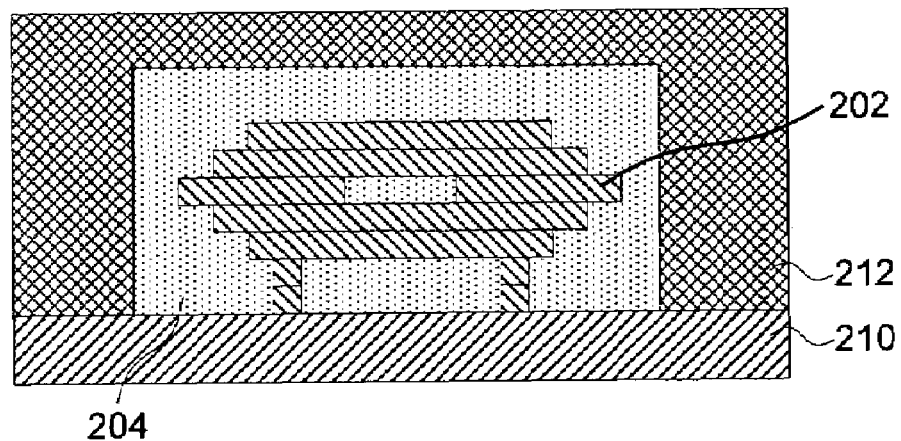
FIGS. 8A-8C schematically provide side views illustrating various stages of an embodiment of FIGS. 5A-5D as applied to a specific group of layers.
Figure 8B:
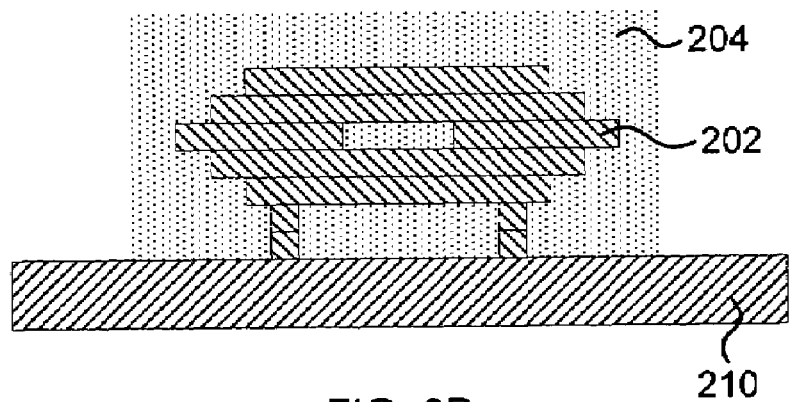
Figure 8C:
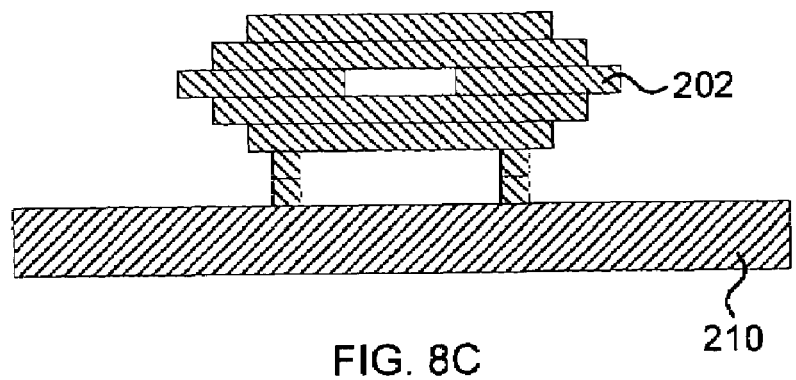

FIGS. 8A-8C depict an example where two different sacrificial materials are used along with a structural material. In this process a stop point is still achieved during the etching process and the number of etching operations are reduced to two instead of three as in the embodiment illustrated in FIGS. 7A-7D. It is possible that the outer sacrificial material 212 may be the same as the structural material forming structure 202. In FIG. 8A a desired multilayer structure 202 is surrounded completely by a first sacrificial material 204 (with the exception of the contact area with the substrate 210) which in turn is surrounded completely by a second sacrificial material 212 (with the exception of the contact area with the substrate 210). A first etch is used to remove the second sacrificial material 212 and a second etch is used to remove the first sacrificial material 204. Any desired post layer fabrication operations can occur between the two etches.

Figure 9A:
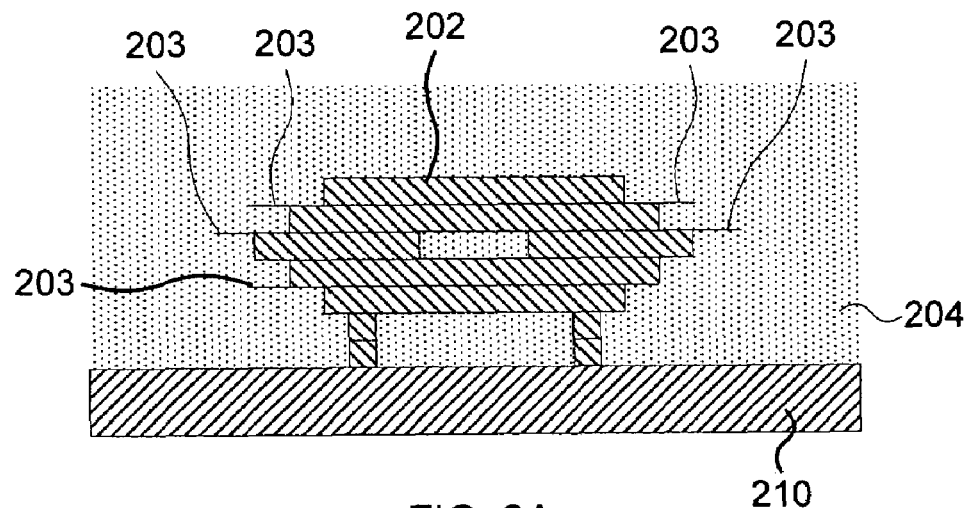
FIGS. 9A-9C schematically provide side views illustrating various stages of an embodiment of FIGS. 6A-6D as applied to a specific group of layers and to a type of structural defect that can be corrected.
Figure 9B:
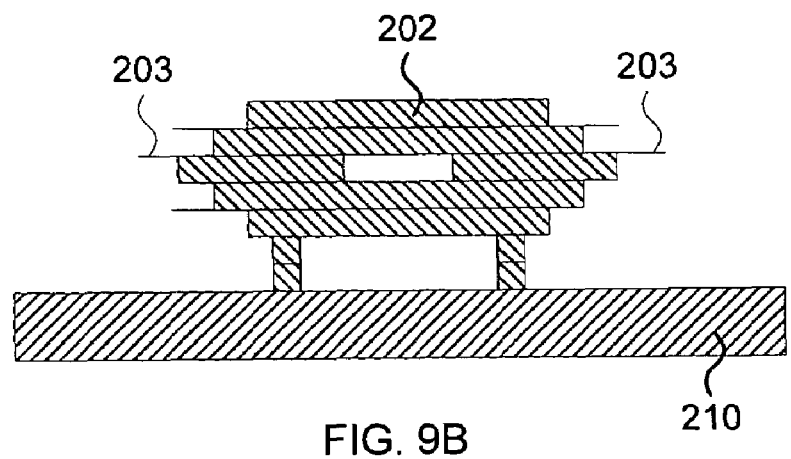
Figure 9C:
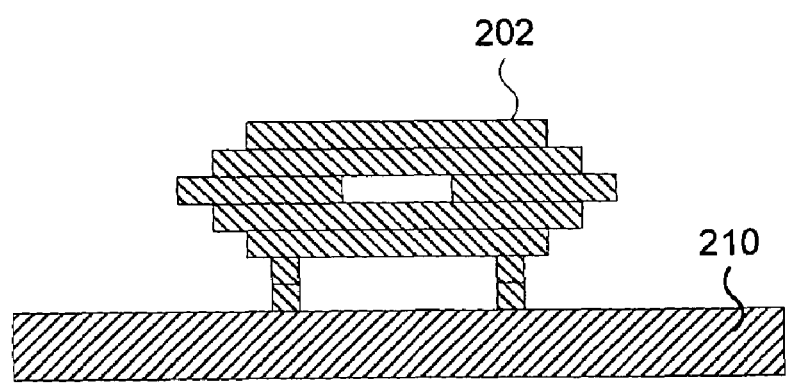

FIGS. 9A-9C illustrate an example where a desired multilayer structure 202 is formed with imperfections 203. These imperfections are shown as very thin "streamers" formed from the same material as that of structure 202. These imperfections may result from the structural material being plated underneath ill seated CC masks (this phenomenon may be termed "flash"), from the structural material being smeared into the sacrificial material during planarization processes (this phenomenon may be termed "smear"), or from the structural material being plated into cracks within the sacrificial material (this phenomenon may be termed "ribbons" and typically results in structures that are vertically elongated and elongated in one lateral dimension but very thin in the other lateral dimension). A first etching operation results in the removal of the sacrificial material 204 as depicted in FIG. 9B but leaves behind the imperfections. Since the imperfections are very thin, a structural material etchant may be used to remove the imperfections while doing little damage to the desired portion of structure 202 as shown in FIG. 9C. As the etchant being used to attack the imperfections also attacks the structure 202, it is important that etching time be controlled. For enhanced control the selected etchant may be used in a diluted form or at a sub-normal temperature.

FIG. 10A depicts a block diagram of a fourth group of embodiments. In this group of embodiments, as with the example of FIGS. 7A-7D, an etching barrier is formed out of a barrier material which may be the same as one of the structural materials or it may be different. The barrier material is chosen based on the fact that the sacrificial material may be etched without etching through the barrier material even though in some embodiments it would be acceptable if the barrier material were damaged by the etchant. In some embodiments of this group, the etching barrier may form a permanent part of a structural element even though its configuration was not part of the intended design. In these embodiments, the configuration of the barrier material does not adversely affect the usability of the intended structure. In some of these embodiments the barrier material may include both a removable element as well as an element that will become a permanent part of the structure. In some of these embodiments, the removable part of the barrier may be removable by, for example, etching operations, planarization operations, or other machining operations. In some embodiments, unlike the example of FIGS. 7A-7D, the etching barrier may be constructed to allow etching access to a portion of the structure while inhibiting etchant from reaching a different portion of the structure.

The process of FIG. 10A begins with Operation 1, designated with reference number 242. Operation 1 calls for the formation of a plurality of layers such that three results are achieved: (1) a desired structure is formed of at least one structural material; (2) a sacrificial support structure is formed of at least one sacrificial material; and (3) an etch barrier is formed out of a barrier material where the etch barrier includes a removable element and may also include a permanent structural element.

After performance of Operation 1 the process moves forward to Operation 2, element 244, which calls for, optionally, the adding on of any additional desired etching barrier elements. Such barrier elements may be positioned at desired locations and held in place in any appropriate manner, for example, by adhesion or by pressing. These additional barrier elements may be conductive materials or dielectric materials, rigid materials, or conformable materials.

After Operation 2 is completed the process moves forward to Operation 3, element 246, which calls for the performance of one or more etching operations which may or may not be intermixed with various desired intermediate operations. From Operation 3 the process moves forward to Operation 4, element 248, which calls for removal of at least one etching barrier.

After Operation 4 is completed the process moves forward to Operation 5, element 250, which calls for the performance of one or more additional etching operations which may or may not be intermixed with various other operations. The completion of Operation 5 may result in the completed release of the desired structure from the sacrificial material or alternatively release may not yet be completed and the process may loop back to element 244, Operation 2, or element 248, Operation 4.

FIG. 10B depicts a process block diagram for a fifth group of embodiments where an etching barrier is again used but where the etching barrier is either not attached to the structural material or substrate or is attached to the structural material or substrate in an easily removable manner. Such attachment would generally be of a minimal nature and would be intended to inhibit accidental release of the barrier material until such a time that it could be safely removed. Alternatively, the minimal attaching structure could ensure that movement of the etching barrier does not adversely impact further etching operations. Examples of minimal attachment structures could be very thin, horizontal or vertical extending post or web like structures. Detachment of the barrier material could occur by gripping the material and snapping the fragile post or web like elements. The thin elements could possibly be destroyed by passing an electric current through them or they could possibly be removed by a controlled etching operations which may attack the desired structure while attacking the attachment elements but if the attachment elements are delicate enough they can possibly be removed prior to an unacceptable amount of damage to the structure occurring.

The process of FIG. 10B begins with Operation 1, element 262. Operation 1 calls for the formation of a plurality of layers such that: (1) a desired structure is formed which includes at least one structural material; (2) a sacrificial support structure is formed and includes at least one sacrificial material; and (3) the formation of at least one etch barrier out of a barrier material where the etch barrier is either not attached to the structural material or is attached to the structural material in an easily removable manner.

From Operation 1 the process moves forward to Operation 2 and then to Operation 3 which are the same Operations called for in the process of FIG. 10A and are given like reference numerals.

The process then moves forward to Operation 4, element 264, which calls for removing at least one etching barrier with or without the stopping of the etching of Operation 3. The removal of the etching barrier will allow a significant enhancement to the etching process in the region that was previously protected by the barrier. The completion of Operation 4 may represent the completed release of the desired structure from the sacrificial material or alternatively it may represent the reaching of an interim state from which the process may loop back to Operation 2 or otherwise continue in a different manner. In some embodiments Operation 3 would be stopped, a different operation performed (e.g. filling the etched region with a dielectric).

The embodiments of the processes of FIGS. 10A and 10B may be used in a variety of circumstances. Some such circumstances may involve the desire to locate dielectric materials or other materials at select locations while still retaining at least some sacrificial material in place so as to keep different portions of a structure from moving relative to one another prior to their being locked in position by an infiltrated material.

Certain devices and structures which may be electrochemically fabricated require or would benefit from a dielectric or other material used as part of the structure, or they may require that their elements remain in a particular geometrical relationship with one another (e.g., as designed), rather than be distorted by stresses, inertial forces, thermal effects, and so forth. The use of another structural material to constrain the movement of elements composed of a primary structural material may be desirable in some cases. Despite these benefits, it may not be desirable to incorporate such a secondary or tertiary structural material on a layer-by-layer basis during fabrication.

RF coaxial components made using electrochemical fabrication (as disclosed in U.S. Provisional Patent Application No. 60/392,531 referenced above) represent examples of devices that may benefit from a combination of partial etching, infiltration, completed etching, and potentially a further infiltration. These coaxial devices may benefit in terms of performance or operating characteristics from a dielectric (or other) material filling the space between the center conductor and shield as they may otherwise be subject to shorting, which would render the device useless, due to the thin, poorly-supported center conductor coming into contact with the shield. Indeed, even if there is no such contact, performance can be compromised if the gaps between center conductor and shield are not as-designed.

Figure 11:
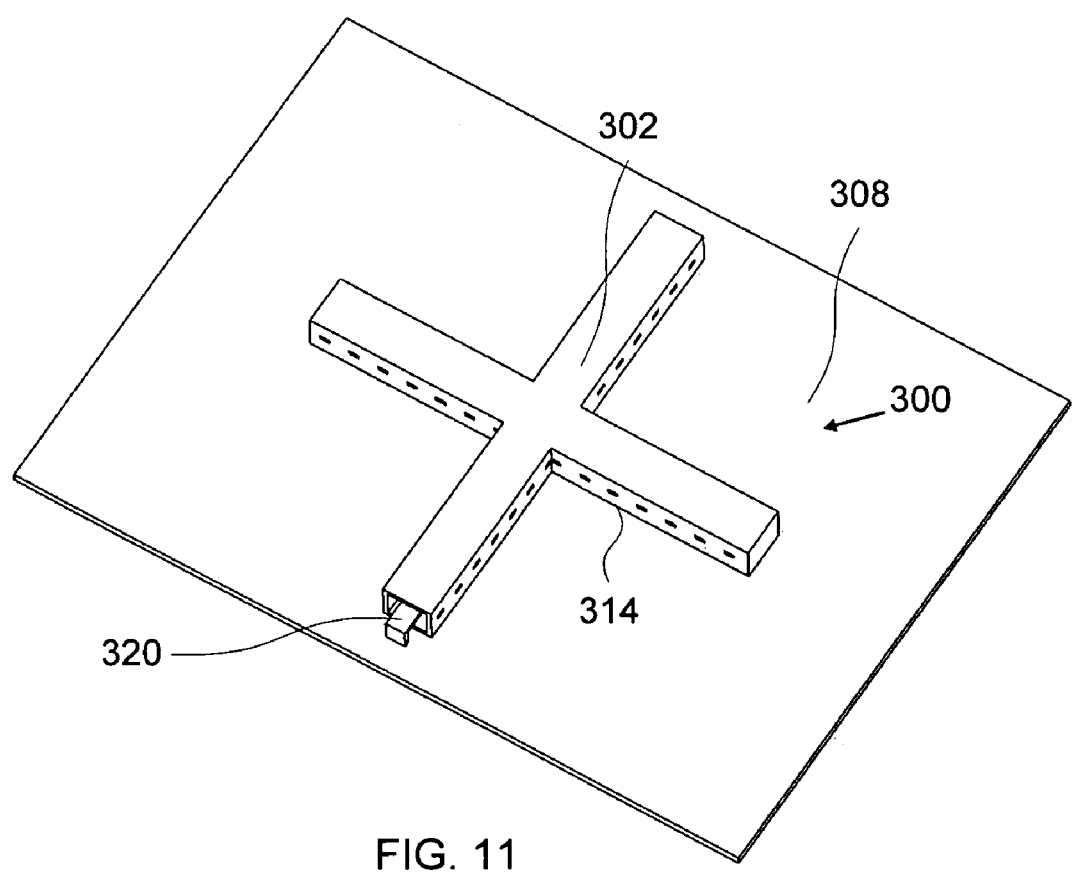
FIG. 11 depicts a perspective view of a simplified RF filter that may be electrochemically fabricated and could benefit form a post process multi-stage or multi-step release of the structural material.

FIG. 11 shows a structure 300 similar to an RF filter set forth in the '531 application on a base 308, but simplified for purposes of illustration. After the structure in FIG. 11 is released by removal of sacrificial material, in principle a dielectric material can be introduced (e.g., by allowing it to wick into the gap between center conductor 320 and shield 302 by introducing it at an open end of the structure or through etching holes 314). However, if the center conductor has already moved from its desired position, introducing the dielectric material may not yield desired operational characteristics of the structure.

The process of FIG. 10A may be applied to ensure the structure is appropriately fabricated. By etching a structure such as that in FIG. 11 in two stages, it is possible to introduce a new material (e.g., a dielectric) into at least part of the region etched during the first stage, before continuing on to the second stage of etching. Specifically, in the case of the RF filter, a portion of the inner or central conductor 320 that may benefit significantly from its intended position is in the region of the intersecting regions of the four arms, where side channel central conductors meet. Thus in this example, it is desirable to stabilize the position of one portion the structure relative to the position of another portion the structure (e.g. the central conductor 320 position relative to the position of the shield 302) by introducing dielectric material between the center conductor and shield in a desired region prior to the final etch, following which the remaining sacrificial material is etched and if desired, dielectric can be introduced into the remaining portion of the structure.

The approach is exemplified schematically in FIGS. 12A-12E. In FIG. 12A, a plane of a portion of the coaxial element is shown from a top view where the plane is chosen to intersect the central conductor 332 as well as the etching and infiltration holes 326. It further shows a sacrificial material 334 filling the space between center conductor 332 and outer conductive shield 338. In some embodiments sacrificial material may also be located outside the shield. In FIG. 12B, one region 342 of the interior of the coaxial element is shown as having been etched out while leaving some sacrificial material 334 to stabilize the central conductor 332 thereby preventing it from moving out of position. Next, the etched region 342 is filled with a dielectric material 344 as shown in FIG. 12C. With the dielectric material 344 now stabilizing the central conductor 332, it is now possible to etch out the remaining sacrificial material 334 leaving open internal regions 346 and 348 as shown in FIG. 12D. Finally, if desired, the resulting open internal spaces can be filled with the same, or with a different, dielectric 344 as shown in FIG. 12E.

The etching and infiltration approach exemplified in FIGS. 12A-12E may be achieved in different ways. For example, such approaches may involve etching performed in two or more stages.

Figure 13:
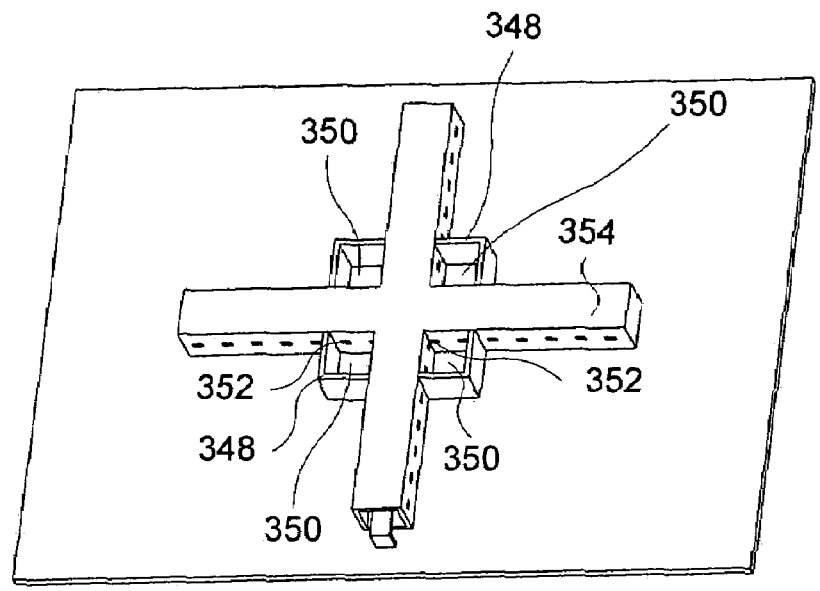
FIG. 13 depicts a perspective view of the RF filter of FIG. 11 with an additional shielding structure forming a "chimney" around the central portion of the structure.
Figure 14A:
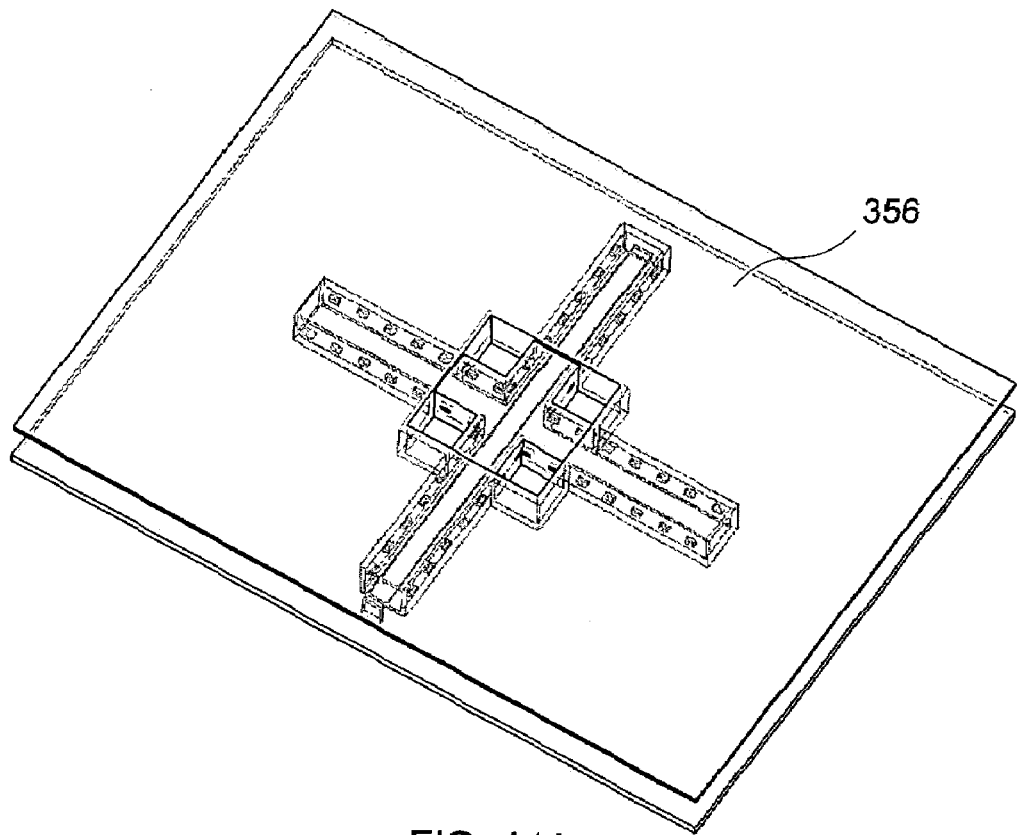
FIGS. 14A and 14B depict the structure of FIG. 13 with the addition of a temporary etch stop layer (shown in FIG. 14A as partially transparent and in FIG. 14B as opaque) that shields the distal regions of the arms of the structure which are outside the "chimney" region.
Figure 14B:
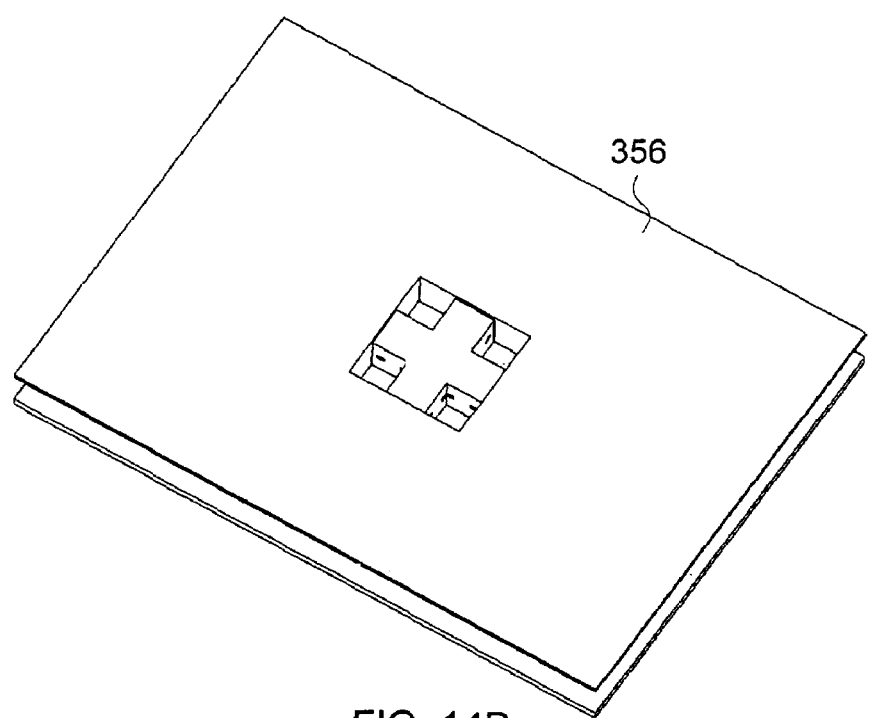

A first example of an etching and infiltration embodiment is explained with the aid of FIGS. 13, 14A, and 14B. In this example initially substantially complete shielding of regions not to be etched is provided (with the exception of inside the structure itself) such that etching will occur only in selected regions. The process includes the following operations: (1) etching occurs, (2) after the initial etching is performed infiltration occurs which provides dielectric support to a desired region, (3) the shielding is at least partially removed, (4) etching of originally shielded regions occurs, and (5) if desired, dielectric infiltration of the originally shielded regions occurs. More specifically in the present example, the shielding includes a permanent structure which is part of the desired structure, a permanent structure that is not part of the desired (or required) design's functionality but which is added as a processing convenience, and a temporary shielding structure that is removed after use.

First a selected region (e.g. the cross region) 350 to be preferentially etched is surrounded by a "chimney" structure 348 made of structural material. The chimney region is further defined by a sheet of structural material formed on a temporary layer 356 or added to the structure after layer formation, where the sheet has an opening over the region 350 to be preferentially etched and shields the sacrificial material elsewhere and serves as an etch stop. FIG. 14A shows the temporary layer 356 over the structure of FIG. 13, with the entire structure including the sacrificial material shown as partially transparent. The temporary layer 356 is fabricated like any other layer, and is bonded to the side walls of the chimney until it is planarized away in a later operation.

Next a time-controlled etch is performed on the structure of FIG. 14A which removes the sacrificial material within the center 'chimney' region, including that between the center conductor and shield as a result of etchant entering etching holes 352 in the sides of shield 354. If etching is stopped once the central conductor is reached, remaining sacrificial material somewhat outside the etching shield regions will remain in place holding the inner conductor in place. This state of the process is shown in FIG. 14B where the temporary layer 356 is shown as opaque.

Next, a dielectric is introduced between the center conductor and shield through the etch holes. The dielectric may optionally fill the chimney area as well. These etching and infiltration steps may be performed within an electrochemical fabrication apparatus by inclusion of an appropriate etching station and infiltration station.

Next, the previously formed temporary layer is removed or erased by planarization, e.g. lapping, so as to restore the structure to it open configuration similar to that of FIG. 13 with the exception of the "cross" region and potentially the chimney region being filled with a dielectric.

Next, the remaining sacrificial material is etched. This may occur after the structure is removed from an EFAB machine or may be performed within the machine. Additional infiltration may be performed if desired.

Figure 15:
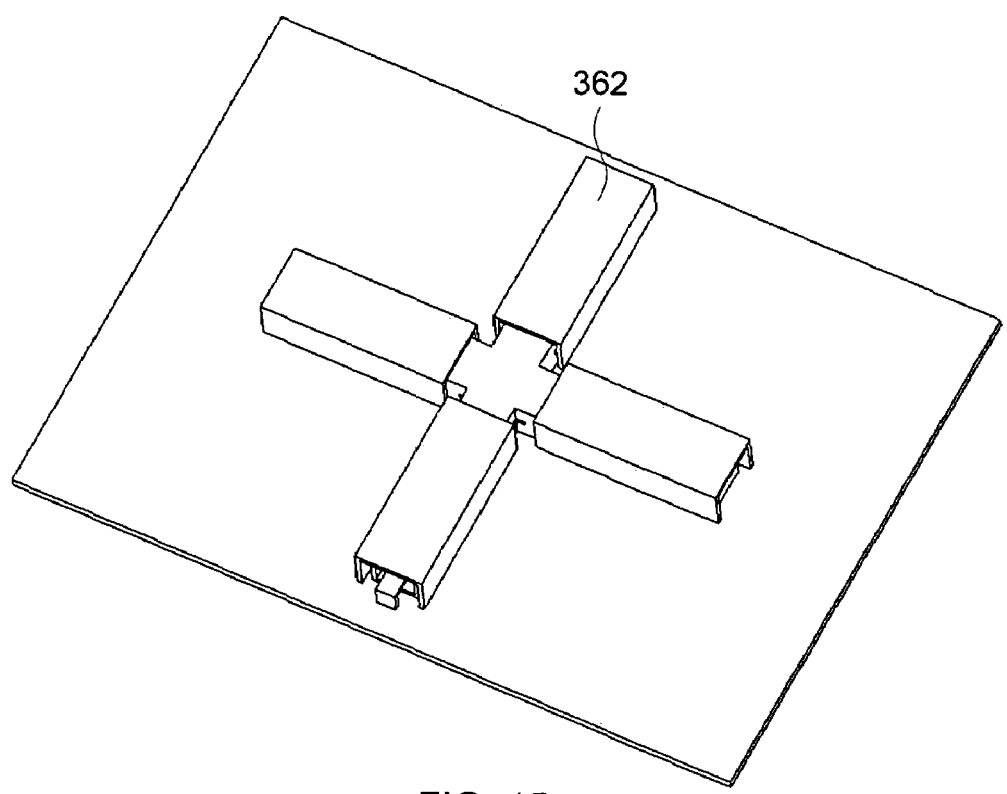
FIG. 15 depicts a perspective view of the same RF filter device of FIGS. 11-14 but with a different form of an etch barrier that aids in providing a multi-stage etching effect.
Figure 16:
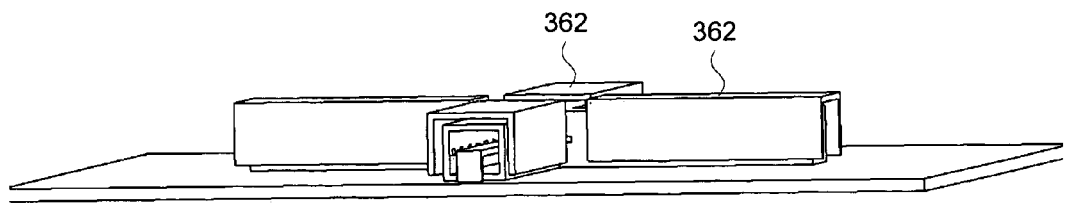
FIG. 16 depicts a perspective view of the RF filter of FIG. 15 where the inside portion of an arm is more clearly visible along with the fact that the etching barrier doesn't extend completely to the substrate.
Figure 17A:
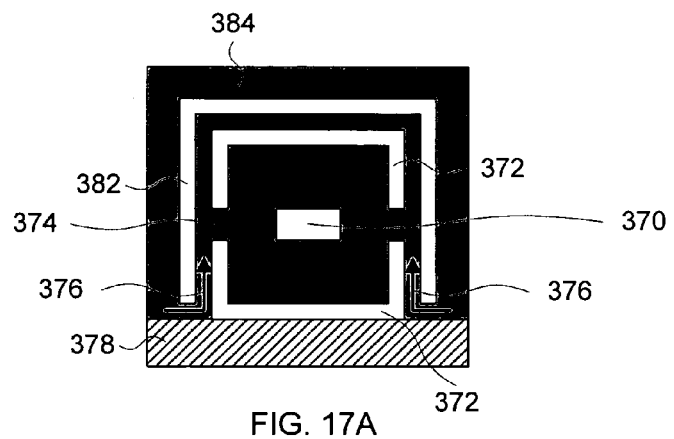

A second example of an etching and infiltration embodiment is explained with the aid of FIGS. 15, 16, and 17A. In this example incomplete shielding is provided (i.e. shielding that doesn't completely block entrance of etchant) in some areas to slow the etching in those regions such that a differential etching rate is achieved between shielded and unshielded regions. More particularly in this example, shielding barriers do not adhere to structural material that remains as part of the structure and they do not adhere to the substrate. The barriers in this example are surrounded by sacrificial material such that once all surrounding sacrificial material is etched, the barriers can be removed or can fall away from the structure (e.g. if the structure is etched up-side down) and thereby allow or cause a differential rate of etching in the initially shielded regions compared to the unshielded regions. As a result of the shielding delays, etching preferably reaches completion in some regions while not reaching completion in other regions. The initial etching can then be terminated, the structure cleaned, infiltration performed in selected regions (e.g. the regions where completion of etching occurred). Etching can then be reinitiated and continued until etching completion is reached in all regions and then a subsequent infiltration performed if desired. In still other embodiments, more than two etching stages may be formed with more than two infiltrations being performed.

In some embodiments, the shields may be configured to form extended etching paths that the etchant must travel along to get to a desired etching location (i.e. etching delayed by extended path length). In other embodiments etching delays may be achieved not based so much on extending the length of the path but instead based on diminishing the sizes of the openings through which the etchant must travel to access a desired etching location (i.e. etching delays based on diminished etching flow path cross-section). In still other embodiments, etching delays may be based on a more balanced combination of these two alternative approaches. In some embodiments, etching barriers may have substantially solid walls where etchant is only allowed to work on removing the shielding by working around its perimeter. In other embodiments, the walls may be perforated with holes such that the etchant can work on removing the barrier in a less path oriented manner.

In the example of the second approach, etch barriers are fabricated along with the filter. These barriers greatly slow the etching in the region of the filter away from the 'cross' in comparison to the etching rate in the region of the 'cross'. Eventually, these barriers become completely released and can be removed from (or fall away from) the device (i.e. the filter in this example). The advantage of the second approach is that no planarization step is required to remove the temporary layer as required by the first approach. As a result, it is easy to perform the entire release and infiltration process outside an EFAB machine.

FIGS. 15, 16, and 17A show the RF component of FIG. 11 but instead of using a chimney structure as depicted in FIGS. 12, 13, 14A, and 14B, etch barriers 362 are designed so as to substantially but not completely surround each of the four 'arms' of the component while leaving the intersecting region of the four arms open or more directly exposed to the etchant. Where the barriers are present, the etchant must first etch out the material between the barrier and the external surface of the shield before the etchant can access the holes in the sides of the outer conductor and thereby begin the inward journey to the central conductor. After a first-stage etch which is timed to remove material between the center conductor and the shield in the intersecting or cross region, dielectric can be introduced into this central region of the device, after which etching can continue until all sacrificial material is removed. At some point during the etching, the barriers will be released and can be allowed to fall away (assuming etching occurs in an upside down manner) or may be otherwise removed. Since in this design the only etching holes are in the side walls of the filter, the tops of the etch barriers might be deleted, so that only two vertical walls are needed, although that will accelerate their separation from the device.

FIG. 17A illustrates an end view of one of the arms where the end of a central conductor 370 can be seen which is surrounded by an outer conductor 372 of the coaxial line which is located on a substrate 378. The outer conductor includes etching holes 374 which can not be accessed until sacrificial material 384 located along paths 376 is removed, and still can not be openly accessed until all sacrificial material 384 between barrier 382 and outer conductor 372 is removed and barrier 382 is removed.

Figure 17B:
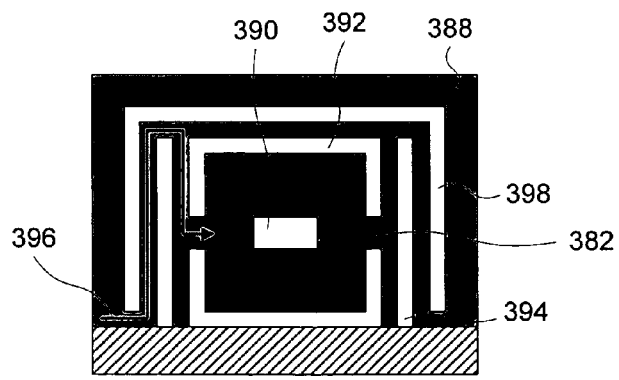
FIG. 17B depicts an end view of the same structure but with a double etching barrier.

FIG. 17B illustrates a coaxial element including central conductor 390 and outer conductor 392 filed with a sacrificial material 388 along with surrounding barriers 394 and 398. The barriers taken together result in an etching path 396 to reach openings 382 being extended considerably compared to that illustrated in FIG. 17A. In some embodiments, such added delays may be necessary or desired to ensure complete etching of the sacrificial material from the intersecting region.

FIGS. 18A and 18B depict block diagrams for two different groups of embodiments that use multi-stage etching operations for etching sacrificial material from a multi-layer structure that is formed as well as from a substrate that includes a sacrificial material (e.g. located in passageways and the like) and/or a component attached to the multi layer structure that includes a sacrificial material (e.g. located within passageways and the like). These embodiments may be useful in a variety of circumstances. For example, the embodiments associated with the process of FIG. 18A may be useful for minimizing the amount of time that the multi-layer structure is exposed to etchant when a larger amount of time is needed to remove sacrificial material from the substrate or other component than is required to remove sacrificial material from the multi-layer structure. The converse is true for embodiments related to the process of FIG. 18B.

The process of FIG. 18A begins with Operation 1, element 402, which calls for the formation of a structure from a plurality of layers wherein the structure is formed on a substrate that has material to be etched or is attached to a component that contains material to be etched. The layers include a structure of desired configuration formed from at least one structural material and they include a sacrificial support structure which is formed from at least one sacrificial material.

After formation of the structure the process moves forward to Operation 2, element 404. Operation 2 calls for the formation of a barrier element, either in conjunction with Operation 1 or alternatively after completion of Operation 1 to protect material of the multi-layer structure from initial attack by etching operations.

From Operation 2 the process moves forward to Operation 3, element 406. Operation 3 calls for performing one or more etching operations with or without those operations being separated by intermediate operations and where the etching operations remove at least part of the sacrificial material from the substrate or component.

After Operation 3 the process moves forward to Operation 4 which calls for the removal of at least one etching barrier which was protecting, at least in part, the materials making up the multi-layer structure.

From Operation 4 the process moves forward to Operation 5, element 410. Operation 5 calls for the performance of one or more additional etching operations to remove sacrificial material from the plurality of layers of the multi-layer structure and where the etching operations may or may not be separated by the performance of intermediate operations.

The process of FIG. 18B is similar to that of FIG. 18A with a few minor changes. Whereas Operation 2 of the process of FIG. 18A formed or called for an etching barrier that protected the material of the multi-layer structure, Operation 2 of FIG. 18B calls for an etching barrier that protects the substrate or component from initial attack by an etchant.

Operation 3 of the process of FIG. 18B is similar to Operation 5 of the process of FIG. 18A wherein etching operations are performed to remove sacrificial material from the plurality of layers making up the multi-layer structure.

Operation 4 in each of the processes of FIGS. 18A and 18B are similar in that they call for the removal of the etching barrier.

Operation 5 of FIG. 18B is similar to Operation 3 of FIG. 18A in that it calls for the performance of one or more etching operations to remove material from the substrate or component.

In these groups of embodiments the fifth operations may complete the release of the structure and substrate or component from the sacrificial material or alternatively these operations may be followed by additional operations that will complete the process.

It should also be understood that Operation 5 of FIG. 18A may not only involve etching of the sacrificial material from the plurality of layers but may also involve the etching of sacrificial material from the substrate or component. Similarly, Operation 5 of FIG. 18B may not be limited to removing sacrificial material from the substrate or component but may also involve removal of additional sacrificial material from the plurality of layers making up the structure.

An example embodiment, following the process of FIG. 18A is depicted in FIGS. 19A-19E.

Figure 19A:
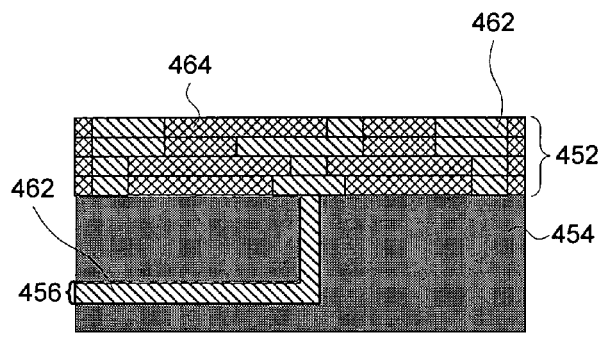
FIGS. 19A-19E schematically depict side views of various states in an implementation of the process of FIG. 18A.

FIG. 19A illustrates a multi layer structure 452 located on a substrate 454 where the substrate includes a passage 456 filled with a sacrificial material 462. The multi layer structure 452 includes regions of sacrificial material 462 and regions of structural material 464. Though it would be nice to perform an etch on the sacrificial material of FIG. 19A to obtain the structure of FIG. 19E using a single operation, this may not be possible. If a long etching time is required to remove the sacrificial material 462 from passage 456, significant damage to the structural material 464 or interlayer interfaces may occur if the multi-layer structure is exposed to etchant during entire time necessary to etch out passage 456. As such, is some circumstances it may be desirable not to jump from the state shown in FIG. 19A to the state shown in FIG. 19E in a single operation. As such, in this embodiment multiple operations will occur to reach the final goal depicted in FIG. 19E.

Figure 19B:
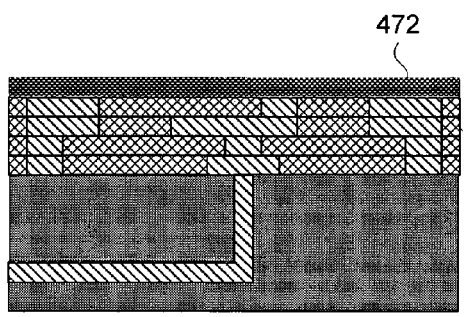

In FIG. 19B an additional layer 472, which is a barrier layer, is added to the multi-layer structure. This barrier layer may be formed of structural material or may be formed of a different material. It is intended that this barrier layer inhibit the etchant used for removing the sacrificial material from passage 456 from reaching the structural material 464. As indicated, this barrier layer may be formed adjacent to the last layer of structure or alternatively with the exception of connecting to an outer ring of structural material, the barrier layer may be spaced from the desired structure by one or more layers of sacrificial material. After the barrier layer 472 is put in place, an etchant is applied to the combined multi-layer structure, substrate, and barrier layer where by the etchant attacks the sacrificial material 462 located in passage 456. The etching is allowed to proceed for a time that is believed appropriate for allowing the passage to become largely free of sacrificial material or even completely free of sacrificial material.

Figure 19C:
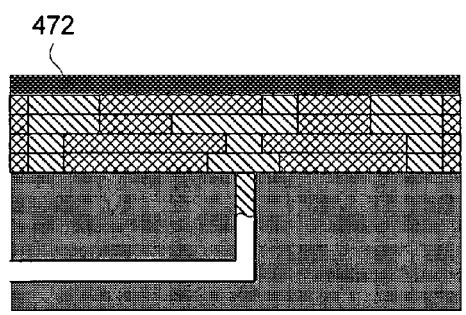
Figure 19D:
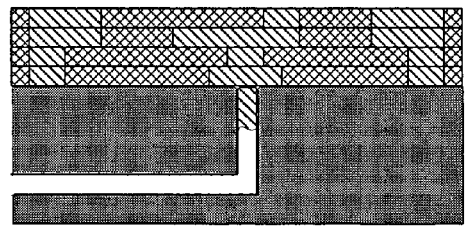

As indicated in FIG. 19C a small amount of sacrificial material remains in the channel near the first layer of the multi-layer structure. After the preliminary etch which substantially clears channel 456, barrier layer 472 is removed as indicated in FIG. 19D. The removal of the barrier layer may occur via a planarization operation or via an etching operation assuming that a suitable etchant for preferentially removing the barrier layer material without damaging the structural material is possessed.

Next an etchant is reapplied whereby the etchant can remove the sacrificial material from the multi-layer structure starting at the top layer and working down while simultaneously the etchant can continue to clear the passage through the substrate whereby both the passage and the multi-layer structure are cleared of sacrificial material while maintaining exposure of the structural material 464 to the etchant to a minimum.

Figure 19E:
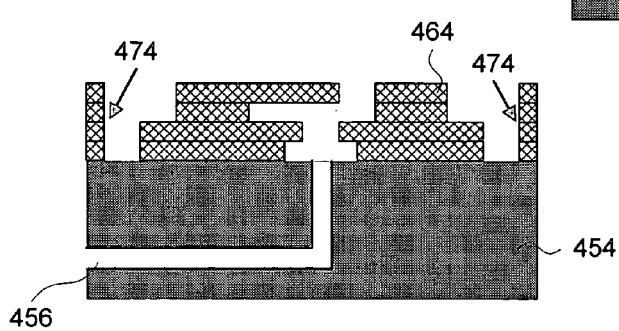

The resulting etched structure, part, component, or device is shown in FIG. 19E. Sidewalls 474 may or may not be intended to stay with the final structure and if desired can be removed, for example by dicing before or after the final etching operation.

It will be appreciated by those of skill in the art that the approaches described herein are not limited to the particular geometries or devices described, but may be applied to a wide variety of situations in which it is desired to perform a multi-stage etch, whether for purposes of incorporating an additional material (e.g., while stabilizing a, structure) or not or whether for the purpose of protecting a specific material or geometry from undue exposure to an etchant as compared to that which is needed to achieve the intended purpose. Similarly it will be understood by those of skill in the art that many variations of the above processes are possible including variations in the numbers of operations, variations in the parameters associated with the operations, variations in etchants, and/or variations in the actual processes selected for forming a given multi-layer structure or given portion of a multi-layer structure.

Numerous alternative embodiments are possible, for example the barrier between two sacrificial materials may roughly conform to the shaped of the desired structure or it may take on some other complex shape if believed to be advantageous. In other alternatives, not all etching barriers may completely surround the desired multilayer structure, in that certain etchants may be allowed to contact certain regions of the desired multilayer structure but may not be allowed to contact other regions of the structure where a different structural material is present. More than three etching operations may be involved. Multiple structural materials may be involved. In additional alternative embodiments not all materials need have contact with the substrate and not all materials need completely surround other materials. In some embodiments etching operations may be performed completely using chemical etchants while in other embodiments electrochemical etching operations may be performed.

The various multi-stage etching operations of the various embodiments of the invention may be performed for a variety of reasons. For example, such reasons may include but are not limited to (1) allowing separation of multiple structures that were simultaneously formed on a common substrate prior to exposing what may be a very fragile multilayer structure to potential harm; (2) allowing a fast acting etchant to remove a large portion of the sacrificial material (which etchant may react negatively with the structural material) and then switching to a different etchant before the desired multilayer structure is exposed; (3) allowing a more uniform etching time when the desired three-dimensional structure is exposed to the etchant; and (4) allowing one etchant to contact a certain portion of the desired multilayer structure so as to remove one sacrificial material but not contact another portion of desired multilayer structure as it could do damage to a second structural material in that location.

The patent applications set forth below are hereby incorporated by reference herein as if set forth in full. The gist of each patent application is included to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways: For example, enhanced methods of producing structures may be derived from the combination of teachings, enhanced structures may be obtainable, enhanced apparatus may be derived, and the like.

U.S. patent application Ser. No. 09/488,142, filed Jan. 20, 2000, and entitled "An Apparatus for Electrochemical Fabrication Comprising A Conformable Mask" is a divisional of the application that led to the above noted '630 patent. This application describes the basics of conformable contact mask plating and electrochemical fabrication including various alternative methods and apparatus for practicing EFAB as well as various methods and apparatus for constructing conformable contact masks.

U.S. Patent Application No. 60/415,374, filed on Oct. 1, 2002, and entitled "Monolithic Structures Including Alignment and/or Retention Fixtures for Accepting Components" is generally directed to permanent or temporary alignment and/or retention structures for receiving multiple components. The structures are preferably formed monolithically via a plurality of deposition operations (e.g. electrodeposition operations). The structures typically include two or more positioning fixtures that control or aid in the positioning of components relative to one another, such features may include (1) positioning guides or stops that fix or at least partially limit the positioning of components in one or more orientations or directions, (2) retention elements that hold positioned components in desired orientations or locations, and (3) positioning and/or retention elements that receive and hold adjustment modules into which components can be fixed and which in turn can be used for fine adjustments of position and/or orientation of the components.

U.S. Patent Application No. 60/464,504, filed on Apr. 21, 2003, and entitled "Methods of Reducing Discontinuities Between Layers of Electrochemically Fabricated Structures" is generally directed to various embodiments providing electrochemical fabrication methods and apparatus for the production of three-dimensional structures from a plurality of adhered layers of material including operations or structures for reducing discontinuities in the transitions between adjacent layers. Some embodiments improve the conformance between a size of produced structures (especially in the transition regions associated with layers having offset edges) and the intended size of the structure as derived from original data representing the three-dimensional structures. Some embodiments make use of selective and/or blanket chemical and/or electrochemical deposition processes, selective and or blanket chemical and/or electrochemical etching process, or combinations thereof. Some embodiments make use of multi-step deposition or etching operations during the formation of single layers.

U.S. Patent Application No. 60/468,979, filed on May 7, 2003, and entitled "EFAB With Selective Transfer Via Instant Mask" is generally directed to three-dimensional structures that are electrochemically fabricated by depositing a first material onto previously deposited material through voids in a patterned mask where the patterned mask is at least temporarily adhered to a substrate or previously formed layer of material and is formed and patterned onto the substrate via a transfer tool patterned to enable transfer of a desired pattern of precursor masking material. In some embodiments the precursor material is transformed into masking material after transfer to the substrate while in other embodiments the precursor is transformed during or before transfer. In some embodiments layers are formed one on top of another to build up multi-layer structures. In some embodiments the mask material acts as a build material while in other embodiments the mask material is replaced each layer by a different material which may, for example, be conductive or dielectric.

U.S. Patent Application No. 60/469,053, filed on May 7, 2003, and entitled "Three-Dimensional Object Formation Via Selective Inkjet Printing & Electrodeposition" is generally directed to three-dimensional structures that are electrochemically fabricated by depositing a first material onto previously deposited material through voids in a patterned mask where the patterned mask is at least temporarily adhered to previously deposited material and is formed and patterned directly from material selectively dispensed from a computer controlled dispensing device (e.g. an ink jet nozzle or array or an extrusion device). In some embodiments layers are formed one on top of another to build up multi-layer structures. In some embodiments the mask material acts as a build material while in other embodiments the mask material is replaced each layer by a different material which may, for example, be conductive or dielectric.

U.S. patent application Ser. No. 10/271,574, filed on Oct. 15, 2002, and entitled "Methods of and Apparatus for Making High Aspect Ratio Microelectromechanical Structures" is generally directed to various embodiments for forming structures (e.g. HARMS-type structures) via an electrochemical extrusion (ELEX™) process. Preferred embodiments perform the extrusion processes via depositions through anodeless conformable contact masks that are initially pressed against substrates that are then progressively pulled away or separated as the depositions thickens. A pattern of deposition may vary over the course of deposition by including more complex relative motion between the mask and the substrate elements. Such complex motion may include rotational components or translational motions having components that are not parallel to an axis of separation. More complex structures may be formed by combining the ELEX™ process with the selective deposition, blanket deposition, planarization, etching, and multilayer operations of EFAB™.

U.S. Patent Application No. 60/435,324, filed on Dec. 20, 2002, and entitled "EFAB Methods and Apparatus Including Spray Metal or Powder Coating Processes", is generally directed to techniques for forming structures via a combined electrochemical fabrication process and a thermal spraying process. In a first set of embodiments, selective deposition occurs via conformable contact masking processes and thermal spraying is used in blanket deposition processes to fill in voids left by selective deposition processes. In a second set of embodiments, selective deposition via a conformable contact masking is used to lay down a first material in a pattern that is similar to a net pattern that is to be occupied by a sprayed metal. In these embodiments a second material is blanket deposited to fill in the voids left in the first pattern, the two depositions are planarized to a common level that may be somewhat greater than a desired layer thickness, the first material is removed (e.g. by etching), and a third material is sprayed into the voids left by the etching operation. The resulting depositions in both the first and second sets of embodiments are planarized to a desired layer thickness in preparation for adding additional layers to form three-dimensional structures from a plurality of adhered layers. In other embodiments, additional materials may be used and different processes may be used.

U.S. Patent Application No. 60/429,483, filed on Nov. 26, 2002, and entitled "Multi-cell Masks and Methods and Apparatus for Using Such Masks to Form Three-Dimensional Structures" is generally directed to multilayer structures that are electrochemically fabricated via depositions of one or more materials in a plurality of overlaying and adhered layers. Selectivity of deposition is obtained via a multi-cell controllable mask. Alternatively, net selective deposition is obtained via a blanket deposition and a selective removal of material via a multi-cell mask. Individual cells of the mask may contain electrodes comprising depositable material or electrodes capable of receiving etched material from a substrate. Alternatively, individual cells may include passages that allow or inhibit ion flow between a substrate and an external electrode and that include electrodes or other control elements that can be used to selectively allow or inhibit ion flow and thus inhibiting significant deposition or etching.

U.S. Patent Application No. 60/429,484, filed on Nov. 26, 2002, and entitled "Non-Conformable Masks and Methods and Apparatus for Forming Three-Dimensional Structures" is generally directed to electrochemical fabrication used to form multilayer structures (e.g. devices) from a plurality of overlaying and adhered layers. Masks, that are independent of a substrate to be operated on, are generally used to achieve selective patterning. These masks may allow selective deposition of material onto the substrate or they may allow selective etching of a substrate whereafter the created voids may be filled with a selected material that may be planarized to yield in effect a selective deposition of the selected material. The mask may be used in a contact mode or in a proximity mode. In the contact mode the mask and substrate physically mate to form substantially independent process pockets. In the proximity mode, the mask and substrate are positioned sufficiently close to allow formation of reasonably independent process pockets. In some embodiments, masks may have conformable contact surfaces (i.e. surfaces with sufficient deformability that they can substantially conform to surface of the substrate to form a seal with it) or they may have semi-rigid or even rigid surfaces. Post deposition etching operations may be performed to remove flash deposits (thin undesired deposits).

U.S. patent application Ser. No. 10/309,521, filed on Dec. 3, 2002, and entitled "Miniature RF and Microwave Components and Methods for Fabricating Such Components" is generally directed to RF and microwave radiation directing or controlling components that may be monolithic, that may be formed from a plurality of electrodeposition operations and/or from a plurality of deposited layers of material, that may include switches, inductors, antennae, transmission lines, filters, and/or other active or passive components. Components may include non-radiation-entry and non-radiation-exit channels that are useful in separating sacrificial materials from structural materials. Preferred formation processes use electrochemical fabrication techniques (e.g. including selective depositions, bulk depositions, etching operations and planarization operations) and post-deposition processes (e.g. selective etching operations and/or back filling operations).

U.S. Patent Application No. 60/468,977, filed on May 7, 2003, and entitled "Method for Fabricating Three-Dimensional Structures Including Surface Treatment of a First Material in Preparation for Deposition of a Second Material" is generally directed to a method of fabricating three-dimensional structures from a plurality of adhered layers of at least a first and a second material wherein the first material is a conductive material and wherein each of a plurality of layers includes treating a surface of a first material prior to deposition of the second material. The treatment of the surface of the first material either (1) decreases the susceptibility of deposition of the second material onto the surface of the first material or (2) eases or quickens the removal of any second material deposited on the treated surface of the first material. In some embodiments the treatment of the first surface includes forming a dielectric coating over the surface while the deposition of the second material occurs by an electrodeposition process (e.g. an electroplating or electrophoretic process).

U.S. patent application Ser. No. 10/387,958, filed on Mar. 13, 2003, and entitled "Electrochemical Fabrication Method and Apparatus for Producing Three-Dimensional Structures Having Improved Surface Finish" is generally directed to an electrochemical fabrication process that produces three-dimensional structures (e.g. components or devices) from a plurality of layers of deposited materials wherein the formation of at least some portions of some layers are produced by operations that remove material or condition selected surfaces of a deposited material. In some embodiments, removal or conditioning operations are varied between layers or between different portions of a layer such that different surface qualities are obtained. In other embodiments varying surface quality may be obtained without varying removal or conditioning operations but instead by relying on differential interaction between removal or conditioning operations and different materials encountered by these operations.

U.S. patent application Ser. No. 10/434,494 filed on May 7, 2003, and entitled "Methods and Apparatus for Monitoring Deposition Quality During Conformable Contact Mask Plating Operations" is generally directed to a electrochemical fabrication (e.g. EFAB) processes and apparatus are disclosed that provide monitoring of at least one electrical parameter (e.g. voltage) during selective deposition where the monitored parameter is used to help determine the quality of the deposition that was made. If the monitored parameter indicates that a problem occurred with the deposition, various remedial Operations may be undertaken to allow successful formation of the structure to be completed.

U.S. patent application Ser. No. 10/434,289 filed on May 7, 2003, and entitled "Conformable Contact Masking Methods and Apparatus Utilizing In Situ Cathodic Activation of a Substrate" is generally directed to an electroplating processes (e.g. conformable contact mask plating and electrochemical fabrication processes) that includes in situ activation of a surface onto which a deposit will be made. At least one material to be deposited has an effective deposition voltage that is higher than an open circuit voltage, and wherein a deposition control parameter is capable of being set to such a value that a voltage can be controlled to a value between the effective deposition voltage and the open circuit voltage such that no significant deposition occurs but such that surface activation of at least a portion of the substrate can occur. After making electrical contact between an anode, that comprises the at least one material, and the substrate via a plating solution, applying a voltage or current to activate the surface without any significant deposition occurring, and thereafter without breaking the electrical contact, causing deposition to occur.

U.S. patent application Ser. No. 10/434,294, filed on May 7, 2003, and entitled "Electrochemical Fabrication Methods With Enhanced Post Deposition Processing" is generally directed to a electrochemical fabrication process for producing three-dimensional structures from a plurality of adhered layers is provided where each layer comprises at least one structural material (e.g. nickel) and at least one sacrificial material (e.g. copper) that will be etched away from the structural material after the formation of all layers have been completed. A copper etchant containing chlorite (e.g. Enthone C-38) is combined with a corrosion inhibitor (e.g. sodium nitrate) to prevent pitting of the structural material during removal of the sacrificial material. A simple process for drying the etched structure without the drying process causing surfaces to stick together includes immersion of the structure in water after etching and then immersion in alcohol and then placing the structure in an oven for drying.

U.S. patent application Ser. No. 10/434,295, filed on May 7, 2003, and entitled "Method of and Apparatus for Forming Three-Dimensional Structures Integral With Semiconductor Based Circuitry" is generally directed to an enhanced electrochemical fabrication processes that can form three-dimensional multi-layer structures using semiconductor based circuitry as a substrate. Electrically functional portions of the structure are formed from structural material (e.g. nickel) that adheres to contact pads of the circuit. Aluminum contact pads and silicon structures are protected from copper diffusion damage by application of appropriate barrier layers. In some embodiments, nickel is applied to the aluminum contact pads via solder bump formation techniques using electroless nickel plating. In other embodiments, selective electroless copper plating or direct metallization is used to plate sacrificial material directly onto dielectric passivation layers. In still other embodiments, structural material deposition locations are shielded, then sacrificial material is deposited, the shielding is removed, and then structural material is deposited.

U.S. patent application Ser. No. 10/434,315, filed on May 7, 2003, and entitled "Methods of and Apparatus for Molding Structures Using Sacrificial Metal Patterns" is generally directed to molded structures, methods of and apparatus for producing the molded structures. At least a portion of the surface features for the molds are formed from multilayer electrochemically fabricated structures (e.g. fabricated by the EFAB™ formation process), and typically contain features having resolutions within the 1 to 100 μm range. The layered structure is combined with other mold components, as necessary, and a molding material is injected into the mold and hardened. The layered structure is removed (e.g. by etching) along with any other mold components to yield the molded article. In some embodiments portions of the layered structure remain in the molded article and in other embodiments an additional molding material is added after a partial or complete removal of the layered structure.

U.S. patent application Ser. No. 10/434,493, filed on May 7, 2003, and entitled "Electrochemically Fabricated Structures Having Dielectric or Active Bases and Methods of and Apparatus for Producing Such Structures" is generally directed to multilayer structures that are electrochemically fabricated on a temporary (e.g. conductive) substrate and are thereafter bonded to a permanent (e.g. dielectric, patterned, multi-material, or otherwise functional) substrate and removed from the temporary substrate. In some embodiments, the structures are formed from top layer to bottom layer, such that the bottom layer of the structure becomes adhered to the permanent substrate, while in other embodiments the structures are form from bottom layer to top layer and then a double substrate swap occurs. The permanent substrate may be a solid that is bonded (e.g. by an adhesive) to the layered structure or it may start out as a flowable material that is solidified adjacent to or partially surrounding a portion of the structure with bonding occurs during solidification. The multilayer structure may be released from a sacrificial material prior to attaching the permanent substrate or it may be released after attachment.

U.S. patent application Ser. No. 10/434,497, filed on May 7, 2003, and entitled "Multistep Release Method for Electrochemically Fabricated Structures" is generally directed to multilayer structures that are electrochemically fabricated from at least one structural material (e.g. nickel), that is configured to define a desired structure and which may be attached to a substrate, and from at least one sacrificial material (e.g. copper) that surrounds the desired structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. In other embodiments, a post-layer formation lid or other enclosure completing structure is added.

U.S. patent application Ser. No. 10/434,519, filed on May 7, 2003, and entitled "Methods of and Apparatus for Electrochemically Fabricating Structures Via Interlaced Layers or Via Selective Etching and Filling of Voids" is generally directed to multi-layer structures that are electrochemically fabricated by depositing a first material, selectively etching the first material (e.g. via a mask), depositing a second material to fill in the voids created by the etching, and then planarizing the depositions so as to bound the layer being created and thereafter adding additional layers to previously formed layers. The first and second depositions may be of the blanket or selective type. The repetition of the formation process for forming successive layers may be repeated with or without variations (e.g. variations in: patterns; numbers or existence of or parameters associated with depositions, etchings, and or planarization operations; the order of operations, or the materials deposited). Other embodiments form multi-layer structures using operations that interlace material deposited in association with some layers with material deposited in association with other layers.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket depositions processes that are not electrodeposition processes. Some embodiments may use selective deposition processes on some layers that are not conformable contact masking processes and are not even electrodeposition processes. Some embodiments may use nickel as a structural material while other embodiments may use different materials such as gold, silver, or any other electrodepositable materials that can be separated from the a sacrificial material. Some embodiments may use copper as a sacrificial material while other embodiments may use silver or other materials. Some embodiments using a nickel structural material and a copper sacrificial material may be selectively etched using a sodium chlorite and ammonium hydroxide based etchant such as Enstrip C-38 sold by Entone-OMI of New Haven Conn. Such an etchant may be used in a diluted form or even have components added such as corrosion inhibitors (e.g. sodium nitrate) to further improve selectivity of the process.

In view of the teachings herein, many further embodiments, alternatives in design and uses of the invention will be apparent to those of skill in the art. As such, it is not intended that the invention be limited to the particular illustrative embodiments, alternatives, and uses described above but instead that it be solely limited by the claims presented hereafter.

We claim:

1. An electrochemical fabrication process for producing a three-dimensional structure from a plurality of adhered layers, the process comprising:
    (A) forming a layer by depositing at least one sacrificial material and at least one structural material onto a substrate or previously formed layer, wherein the depositing of at least one of the materials comprises an electrodeposition operation;
    (B) repeating (A) one or more times such that a plurality of layers are formed and such that successive layers are formed adjacent to and adhered to previously formed layers, wherein the three-dimensional structure is formed from at least a portion of the at least one structural material that was deposited in (A) and (B);
    (C) performing a first etching operation to remove at least a first portion of at least a first material from multiple layers of the plurality of layers, wherein the first material is at least one of the at least one sacrificial material;
    (D) performing a second etching operation, after the first etching operation, to remove at least a portion of at least a second material, which is different from the first material, from multiple layers of the plurality of layers and wherein the second material is selected from a group consisting of the at least one sacrificial material and the at least one structural material; and
    (E) performing a third etching operation that removes an additional quantity of the first material that was protected from removal by the second material prior to removal of the second material,
    wherein the three-dimensional structure is released from the at least one sacrificial material.

2. The process of claim 1 wherein the depositing of at least one sacrificial material and at least one structural material comprise at least one selective depositing operation and wherein the plurality of layers formed are formed using a plurality of selective depositing operations, the process additionally comprising:
    supplying a plurality of preformed masks, wherein each mask comprises a patterned dielectric material that includes at least one opening through which deposition can take place during formation of at least a portion of a layer, and wherein each mask further comprises a support structure that supports the patterned dielectric material;
    wherein at least a plurality of the selective depositing operations comprise:
        (1) contacting the substrate or the previously formed layer and the dielectric material of a selected preformed mask;
        (2) in the presence of a plating solution, performing the electrodeposition operation by conducting an electric current through the at least one opening in the selected mask between an anode and the substrate or the previously formed layer, whereby a deposition material, selected from the group consisting of the at least one sacrificial material and the at least one structural material, is deposited onto the substrate or onto the previously formed layer to form the at least a portion of a layer; and
        (3) separating the selected preformed mask from the substrate or previously formed layer.

3. The process of claim 1 wherein the depositing of at least one sacrificial material and at least one structural material further comprises at least one selective depositing operation and wherein the plurality of layers formed are formed using a plurality of selective depositing operations, the process additionally comprising:
(1) providing an adhered patterned mask on a surface of the substrate or previously formed layer, wherein the mask includes at least one opening;
(2) in the presence of a plating solution, performing the electrodeposition operation by conducting an electric current through the at least one opening in the adhered mask between an anode and the substrate or previously formed layer, whereby a deposition material, selected from the group consisting of the at least one sacrificial material and the at least one structural material, is deposited onto the substrate or previously formed layer; and
(3) removing the mask from the substrate or previously formed layer.

4. The process of claim 1 wherein the performing of the first etching operation comprises use of a first etchant and the first etchant selectively attacks the first material, and is substantially non-reactive with regard to the second material.

5. The process of claim 4 wherein the second material comprises nickel and the first material comprises copper.

6. An electrochemical fabrication process for producing a three-dimensional structure from a plurality of adhered layers, the process comprising:
(A) forming a layer by depositing at least one sacrificial material and at least one structural material onto a substrate or previously formed layer, and wherein the depositing of at least one of the materials comprises an electrodeposition operation;
(B) repeating (A) one or more times such that a plurality of layers are formed and such that successive layers are formed adjacent to and adhered to previously formed layers wherein the plurality of layers include the three-dimensional structure which is formed from the at least one structural material and which is at least partially surrounded by the at least one sacrificial material;
(C) performing a first etching operation to remove at least a first portion of at least a first sacrificial material, which is one of the at least one sacrificial material, from multiple layers of the plurality of layers;
(D) performing an intervening operation after performing the first etching operation;
(E) performing a second etching operation, after the intervening operation, to remove an additional quantity of the first sacrificial material from multiple layers of the plurality of layers;
wherein during or after formation of the three-dimensional structure at least one etching barrier is provided to limit removal of a second portion of the first sacrificial material from at least a portion of the three-dimensional structure during the first etching operation, and
wherein the intervening operation removes at least a portion of the etching barrier.

7. The process of claim 6 wherein the formation of the plurality of layers further comprises formation of the at least one etching barrier that is not attacked by the first etching operation and wherein the at least one etching barrier is adhered only to at least one of the at least one sacrificial material.

8. The process of claim 7 wherein the etching barrier falls away from the three-dimensional structure after a surrounding quantity of the at least one sacrificial material has been removed.

9. An electrochemical fabrication process for producing a three-dimensional structure from a plurality of adhered layers, the process comprising:
(A) forming a layer by depositing at least one sacrificial material and at least one structural material onto a substrate or previously formed layer, and wherein the depositing of at least one of the materials comprises an electrodeposition operation;
(B) repeating (A) one or more times such that a plurality of layers are formed and such that successive layers are formed adjacent to and adhered to previously formed layers wherein the plurality of layers include the three-dimensional structure which is formed from the at least one structural material and which is at least partially surrounded by the at least one sacrificial material;
(C) performing a first etching operation to remove at least a first portion of at least a first material, selected from the group consisting of the at least one sacrificial material and the at least one structural material, from multiple layers of the plurality of layers;
(D) performing an intervening operation, after performing the first etching operation;
(E) performing a second etching operation, after the intervening operation, to remove at least a portion of at least a second material, selected from the group consisting of the at least one sacrificial material and the at least one structural material, from multiple layers of the plurality of layers;
wherein during or after formation of the three-dimensional structure at least one etching barrier is provided to protect at least a portion of the three-dimensional structure, and
wherein the intervening operation comprises a planarization operation which removes at least a portion of the etching barrier.

10. An electrochemical fabrication process for producing a three-dimensional structure from a plurality of adhered layers, the process comprising:
(A) forming a layer by depositing at least one sacrificial material and at least one structural material onto a substrate or previously formed layer, and wherein the depositing of at least one of the materials comprises an electrodeposition operation;
(B) repeating (A) one or more times such that a plurality of layers are formed and such that successive layers are formed adjacent to and adhered to previously formed layers wherein the plurality of layers include the three-dimensional structure which is formed from the at least one structural material and which is at least partially surrounded by the at least one sacrificial material;
(C) performing a first etching operation to remove at least a first portion of at least a first material, selected from the group consisting of the at least one sacrificial material and the at least one structural material, from multiple layers of the plurality of layers;
(D) performing an intervening operations after performing the first etching operation;
(E) performing a second etching operation, after the intervening operation, to remove at least a portion of at least a second material, which includes at least a portion of the at least one sacrificial material, from multiple layers of the plurality of layers, wherein during or after formation of the three-dimensional structure at least one etching barrier is provided to protect at least a portion of the three-dimensional structure, wherein the first portion of at least the first material is at least in part located in a passage within the substrate, wherein the intervening operation comprises an at least partial removal of the etching barrier, and wherein the at least portion of the second material was protected by the etching barrier.

11. The process of claim 10 wherein the second etching operation attacks the second material which is a sacrificial material forming part of the plurality of layers.

* * * * *